(12) United States Patent
Yamazaki et al.

(10) Patent No.: US 6,995,509 B2
(45) Date of Patent: Feb. 7, 2006

(54) ORGANIC LIGHT EMITTING ELEMENT AND A LIGHT EMITTING DEVICE USING THE SAME

(75) Inventors: Hiroko Yamazaki, Kanagawa (JP); Satoshi Seo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 154 days.

(21) Appl. No.: 10/744,600

(22) Filed: Dec. 24, 2003

(65) Prior Publication Data

US 2005/0077817 A1 Apr. 14, 2005

(30) Foreign Application Priority Data

Dec. 26, 2002 (JP) .............................. 2002-378523

(51) Int. Cl.
*H01J 1/63* (2006.01)
(52) U.S. Cl. ...................................... 313/504; 313/506
(58) Field of Classification Search ................ 313/498, 313/503, 504, 506, 512
See application file for complete search history.

(56) References Cited

U.S. PATENT DOCUMENTS

| 5,283,132 A | 2/1994 | Ogura et al. |
| 6,614,176 B2 | 9/2003 | Kim et al. |
| 2002/0008233 A1 | 1/2002 | Forrest et al. |
| 2002/0027416 A1 | 3/2002 | Kim et al. |
| 2003/0178619 A1 | 9/2003 | Forrest et al. |

FOREIGN PATENT DOCUMENTS

| JP | 04-284395 | 10/1992 |
| JP | 08-078163 | 3/1996 |
| JP | 10-264970 | 10/1998 |
| JP | 2001-313180 | 11/2001 |
| JP | 2002-225949 | 8/2002 |
| WO | WO 01/08230 A1 | 2/2001 |

OTHER PUBLICATIONS

Baldo, M. et al., "*Highly Efficient Phosphorescent Emission From Organic Electroluminescent Devices*", Nature, vol. 395, Sep. 10, 1998, pp. 151-154.

(Continued)

*Primary Examiner*—Vip Patel
(74) *Attorney, Agent, or Firm*—Nixon Peabody LLP; Jeffrey L. Costellia

(57) ABSTRACT

The present invention provides a white organic light-emitting element high in the emission efficiency. In particular, the invention provides a white organic light-emitting element that has an emission spectrum having peaks in the respective wavelength regions of red color, green color and blue color and is high in the emission efficiency.

Since a spectrum region lowest in the emission efficiency is a red region, by introducing a reddish phosphorescent material, a highly efficient white organic light-emitting element is obtained. At this time, in order to inhibit the reddish phosphorescent material from singularly emitting, as shown in FIG. 1, a distance between a second emission region 114 where a reddish phosphorescent material 124 is a luminescent material and a first emission region 113 that exhibits emission in a shorter wavelength side than the second emission region is separated. In a configuration shown in FIG. 1, it is preferable to use an electron transport material in a layer 115 between the first emission region and the second emission region and more preferable to use a hole block material.

71 Claims, 12 Drawing Sheets

OTHER PUBLICATIONS

Baldo, M. et al., "*Very High-Efficiency Green Organic Light-Emitting Devices Based on Electrophosphorescence*", Applied Physics Letters., vol. 75, No. 1, Jul. 5, 1999, pp. 4-6.

O'Brin, D. et al., "*Improved Energy Transfer in Electrophosphorescent Devices*", Applied Physics Letters, vol. 74, No. 3, Jan. 18, 1999, pp. 442-444.

International Search Report Dated Feb. 3, 2004 for PCT/JP03/16168.

FIG. 2
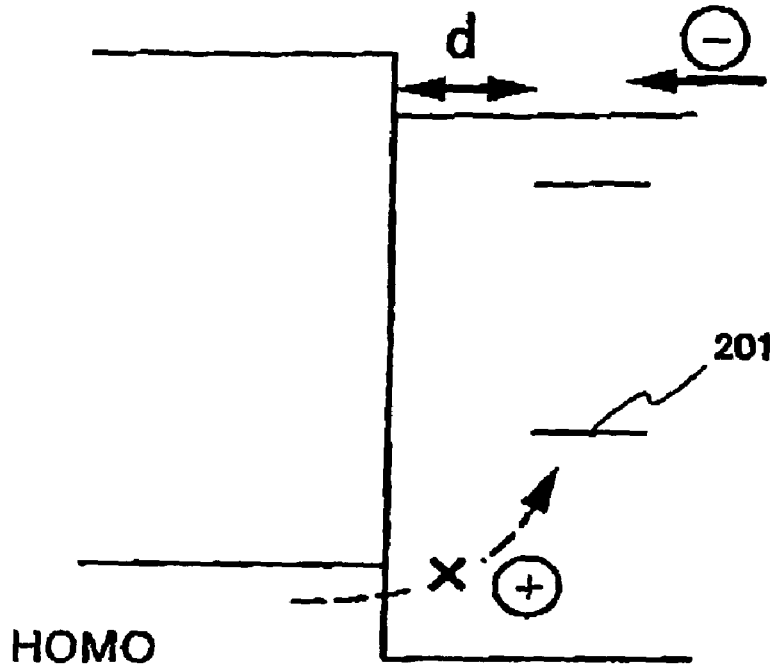
(a)
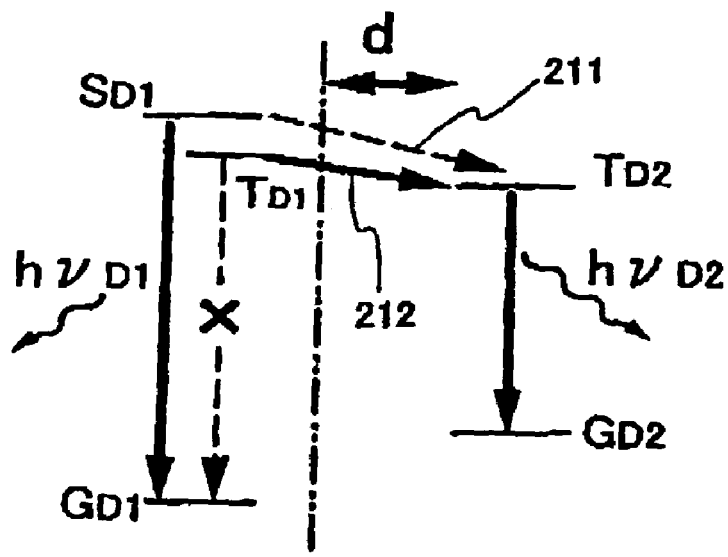
(b)

FIG. 10
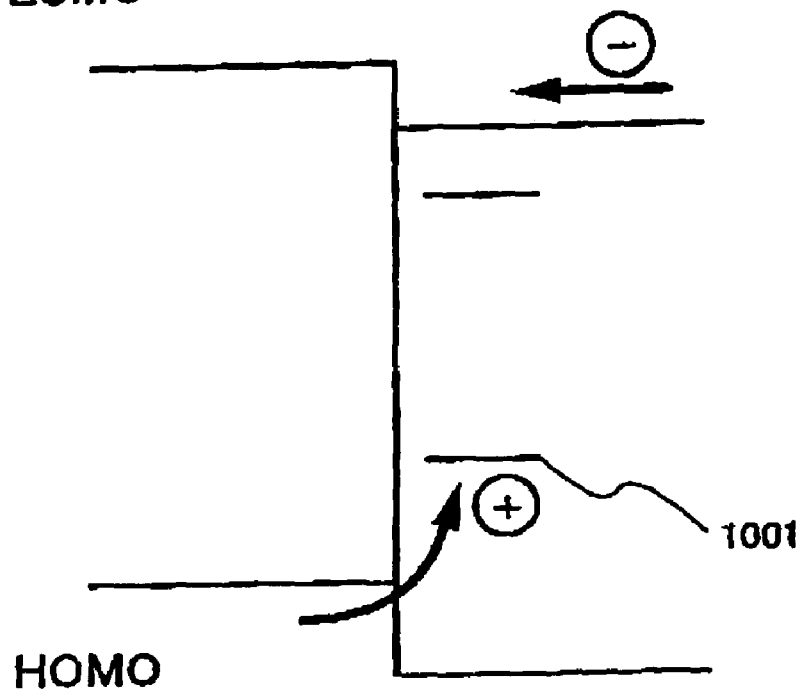
(a)
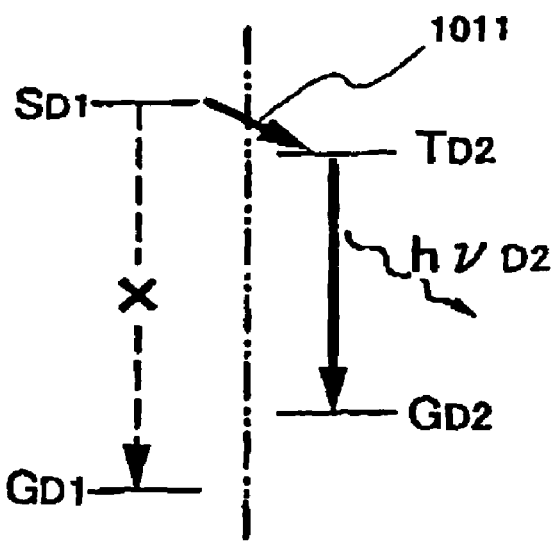
(b)

ORGANIC LIGHT EMITTING ELEMENT AND A LIGHT EMITTING DEVICE USING THE SAME

TECHNICAL FIELD

The present invention relates to an organic light-emitting element that comprises an anode, a cathode, and a layer containing an organic compound (hereinafter, electroluminescent layer) that generates light by applying electric field through the electrodes; and a light-emitting device that comprises the organic light-emitting element. Specifically, the present invention relates to a light-emitting element that exhibits white emission and a full color light-emitting device comprising the organic light-emitting element.

BACKGROUND ART

An organic light-emitting element emits light when electric field is applied thereto. The emission mechanism is a carrier injection type. That is, by applying voltage through a pair of electrodes that interposes an electroluminescent layer therebetween, electrons injected from a cathode and holes injected from an anode are recombined within the electroluminescent layer to form molecules in excited states (hereinafter, excited molecule), and the excited molecules return to the ground state while radiating energy to emit light.

There are two excited states possible from organic compounds, the singlet state and the triplet states. Light emission from the singlet state is referred to as fluorescence and the same from the triplet state is referred to as phosphorescence.

In such organic light-emitting element, an electroluminescent layer is generally formed to have a thickness of below 1 $\mu$m. Further, since the organic light-emitting element is a self-luminous element in which an electroluminescent layer emits light, a back light used for the conventional liquid crystal display device is unnecessary. Therefore, the organic light-emitting element has a great advantage of being manufactured to have a ultra thin film thickness and light weight.

In the case of an electroluminescent film with a thickness of approximately 100 nm to 200 nm, the time between the injection of carriers and their recombination is about several ten nanoseconds considering the carrier mobility. Hence, the time required for the process of injecting carriers and emitting light of the electroluminescent layer is on the order of microsecond. Thus, an extremely high response speed is one of the advantages thereof.

Further, since an organic light-emitting element is carrier injection type, it can be driven by a direct current voltage, thereby noise is hardly generated. With respect to a drive voltage, an electroluminescent layer is formed into a uniform ultra thin film having a thickness of approximately 100 nm, and a material for an electrode is selected to reduce a carrier injection barrier. Further, a hetero structure (two-layers structures is introduced. Accordingly, a sufficient luminance of 100 cd/m$^2$ can be obtained at an applied voltage of 5.5 V (non-patent literature 1: C. W. Tang and S. A. VanSlyke, Applied Physics Letters, vol. 51, No. 12, pp. 913–915 (1987)).

An organic light-emitting element has been attracted attention as a next generation's device for a flat panel display in terms of the thin thickness and lightweight, the high response speed, the direct low voltage operation, or the like. In addition, the organic light-emitting element can be used effectively as the element for the display screen of a portable electric appliance in terms of the self luminous type, the wide viewing angle, and the high level of visibility.

Wide variations of emission color is also one of the advantages of the organic light-emitting element. Richness of color is resulted from the multiplicity of an organic compound itself. That is, an organic compound is flexible enough to be developed to various materials by designing molecules (such as introducing substituent). Accordingly, the organic light-emitting element is rich in color.

From these viewpoints, it would not be an overstatement to say that the biggest application area of an organic light-emitting element is a full color flat panel display device. Various means for full colorization have been developed in view of characteristics of the organic light-emitting element. At present, there are three primary methods of forming the structure of a full color light-emitting device by using the organic light-emitting element.

First, the method that organic light-emitting elements having three primary colors, that is, red (R), green (G), and blue (B) are patterned, respectively, by shadow mask technique to serve them as pixels (hereinafter, RGB method). Second, a blue organic light-emitting element is used as a light emission source, and the blue emission is converted into green or red by color changing material (CCM) made from phosphorescent material to obtain three primary colors (hereinafter, CCM method). Third, a white organic light-emitting element is used as a light emission source, and a color filter (CF) used for a liquid crystal display device or the like is provided to obtain three primary colors (hereinafter, CF method).

Among these, in the CCM system and the CF system, an organic light-emitting element that is used therein emits monochromatic light such as blue (CCF system) or white (CF system); accordingly, different from the RGB system, precise separate coating by use of a shadow mask is not necessary. Furthermore, a color conversion material or a color filter can be manufactured according to an existing photolithography technique, and there is no need of complicated processes. Still furthermore, other than merits from a process point of view, there is another advantage in that since only one kind of element is used, the brightness varies uniformly with time; accordingly, the color shift or irregular brightness with time are not caused.

However, in case of adopting the CCM method, there has been a problem in red color since color conversion efficiency of from blue to red is poor in principle. In addition, there has been a problem that the contrast becomes deteriorated since a color conversion material itself is fluorescent so that light is generated in pixels due to outside light such as sunlight. CF method has no such problems since a color filter is used as well as the conventional liquid display device.

Accordingly, although the CF method has comparative few disadvantages, the CF method has a problem that a high efficient white organic light-emitting element is indispensable to the CF method since a great deal of light is absorbed into the color filter. A mainstream white organic light-emitting element is the element that combines complementary colors (such as blue and yellow) (hereinafter, two wavelengths white light-emitting element) instead of white color having the peak intensity in each wavelength of R, G, and B (non-patent literature 2: Kido et al., "46$^{th}$ Applied Physics Relation Union Lecture Meeting" p1282, 28a-ZD-25 (1999)).

However, considering a light-emitting device combined with a color filter, a white organic light-emitting element having an emission spectrum with the peak intensity in each wavelength of R, G, and B (hereinafter, three wavelengths white light-emitting element) is desirable instead of the two wavelengths white light-emitting element, which was reported in the non-patent literature 2.

Such three wavelengths white light-emitting element has been reported several times (for instance, non-patent literature 3: J. Kido at al., Science, vol. 267, 1332–1334 (1995)). However, such three wavelengths white light-emitting element is inferior to the two wavelengths white light-emitting element in terms of luminous efficiency, consequently, significant improvement is required.

Furthermore, irrespective of two-wavelength type or three-wavelength type, white emission can be applied also to lighting and so on. From such meaning too, development of a highly efficient white organic light-emitting element is desired.

DISCLOSURE OF THE INVENTION (Problems that the Invention is to Solve)

In this connection, the present invention intends to provide a while organic light-emitting element that is high in the emission efficiency. In particular, the invention intends to provide a white organic light-emitting element that has an emission spectrum that has peaks in the respective wavelength regions of red color, green color and blue color and is high in the efficiency.

Furthermore, the invention intends, by manufacturing a light-emitting device with the organic light-emitting element, to provide a light-emitting device that is lower in the power consumption more than ever. In the present specification, "a light-emitting device" indicates a light-emitting device or an image display device that uses an organic light-emitting element. Furthermore, all of a module in which to an organic light-emitting element a connector such as a flexible printed circuit (FPC) or a TAB (Tape Automated Bonding) tape or a TCP (Tape Carrier Package) is attached, a module in which to a tip end of the TAB or TCP a printed wiring board is disposed, or a module in which an IC (integrated circuit) is directly mounted on an organic light-emitting element according to a COG (Chip On Glass) method are included in the light-emitting device.

(Means for Solving the Problems)

In the case of a white emission spectrum, in particular, an emission spectrum having peaks in the respective wavelength regions of red color, green color and blue color, it is considered that a spectrum region poorest in the emission efficiency is a red region. This is because the emission efficiencies of red emitting materials are generally lower than that of others. In view of the circumstance, the present invention intends to realize a highly efficient white organic light-emitting element by introducing a reddish phosphorescent material.

A phosphorescent material is a material that can convert a triplet excitation state to emission, that is, a material that can emit phosphorescence. It is known that since in an organic light-emitting element it is considered that a singlet excitation state and a triplet excitation state are generated at a ratio of 1:3, when a phosphorescent material is used high emission efficiency can be achieved.

However, in the case of a red phosphorescent material being introduced in a structure of a white organic light-emitting element such as shown in non-patent literature 2, only the red color is emitted, other components such as blue one or green one cannot be observed. As a result, white emission cannot be obtained. That is, since a phosphorescent material easily converts excitation energy larger than itself to emission of itself, a white organic light-emitting element in which a reddish phosphorescent material is introduced can be said to be difficult to realize.

The present inventors found, after studying hard, that by applying an element structure shown below a white organic light-emitting element in which a reddish phosphorescent material is introduced can be realized.

That is, a configuration of the present invention is characterized in that in an organic light-emitting element in which an electroluminescent layer that has a first emission region and a second emission region the maximum peak of an emission spectrum of which is located in a longer wavelength side than the first emission region is disposed between an anode and a cathode, emission in the second emission region is one from a triplet excitation state and the second emission region is located apart from the first emission region.

In the above, the second emission region is preferably constituted of a host material and a guest material that exhibits emission from a triplet excitation state.

Furthermore, the configurations are particularly effective when the emission from the first emission region is one from a singlet excitation state. Accordingly, in the invention, the emission from the first emission region is characterized by being the emission from a singlet excitation state. In this case, a configuration of the first emission region is preferably one that includes a host material and one kind or a plurality of guest materials that exhibits emission from a singlet excitation state.

Still furthermore, a more preferable configuration in the abovementioned organic light-emitting element according to the invention is one in which the first emission region is located toward an anode more than the second emission region. In this case, in order to design a carrier recombination region in the neighborhood of the first emission region, between the first emission region and the second emission region, a layer made of a hole block material that has an ionization potential larger than a substance having the largest ionization potential of substances contained in the first emission region is preferably disposed. A value of the ionization potential of the hole block material is preferably 0.4 eV or more larger than a value of the ionization potential of a substance that has the largest ionization potential of substances contained in the first emission region.

Furthermore, in the configuration according to the invention, in order to allow both of the first emission region and the second emission region to emit efficiently, a distance between the first emission region and the second emission region is preferably 1 nm or more and 30 nm or less. More preferably, it is 5 nm or more and 20 nm or less.

One of intentions of the invention is to manufacture a highly efficient white organic light-emitting element. At this time, when light that is generated from the first emission region on a shorter wavelength side and light that is generated from the second emission region on a longer wavelength side are combined with a good balance, high quality white emission can be realized. Accordingly, an emission wavelength of the first emission region and that of the second emission region preferably satisfy the conditions below.

That is, in the invention, an emission spectrum in the first emission region has at least one peak in a region of 400 nm or more and 500 nm or less. Alternatively, it has at least two peaks in a region of 400 nm or more and 560 nm or less.

Furthermore, an emission spectrum in the second emission region has at least one peak in a region of 560 nm or more and 700 nm or less.

When the first and second emission regions that exhibit emission in the wavelength regions as mentioned above are combined, highly efficient and high-quality white organic light-emitting element can be obtained.

Here, as the emission in the first emission region, excimer emission can be used. When thus configured, since emission having two peaks can be easily taken out of the first emission region, when this is combined with the emission from the second emission region, white emission having peaks in the respective wavelength regions of R, G and B can be easily realized. Accordingly, in the invention, in the case of an emission spectrum in the first emission region having at least two peaks in a region of 400 nm or more and 560 nm or less, the emission in the first emission region includes excimer emission.

In the abovementioned organic light-emitting element according to the invention, the emission in the second emission region is one from a triplet excitation state. As materials that exhibit such an emission, an organometallic complex can be preferably used. Furthermore, in particular, from the highness of the emission efficiency, the organometallic complex that has iridium or platinum as a central metal can be preferably used.

When a light-emitting device is prepared by use of the abovementioned organic light-emitting element according to the invention, a light-emitting device having lower power consumption more than ever can be provided. Accordingly, the invention includes a light-emitting device that uses an organic light-emitting element according to the invention as well.

(Advantages of the Invention)

By practicing the present invention, a white organic light-emitting element having high light emission efficiency can be provided. Especially, a high efficient white organic light-emitting element, which has the peak intensity in each wavelength region of red, green, and blue, can be provided. Moreover, by manufacturing a light-emitting device using the organic light-emitting element, a light-emitting device, which operates at lower power consumption than that of the conventional light-emitting device, can be provided.

BRIEF DESCRIPTION OF THE DRAWINGS

FIGS. 2A and 2B are diagrams showing an emission mechanism in the organic light-emitting element according to the invention.

FIGS. 10A and 10B are diagrams showing an emission mechanism in the existing organic light-emitting element.

BEST MODE FOR CARRYING OUT THE INVENTION

Embodiments of the present invention will be explained below.

(Embodiment 1)

In what follows, of embodiments of the invention, principles of operation and specific examples of configuration are cited and detailed. In an organic light-emitting element, in order to extract emission, any one of electrodes has only to be transparent. Accordingly, not only an existing element structure in which a transparent electrode is formed on a substrate and light is extracted from a substrate side but also a structure in which light is actually extracted from a side opposite to the substrate and a structure in which light is extracted from both sides of an electrode can be applied.

Figure 9:
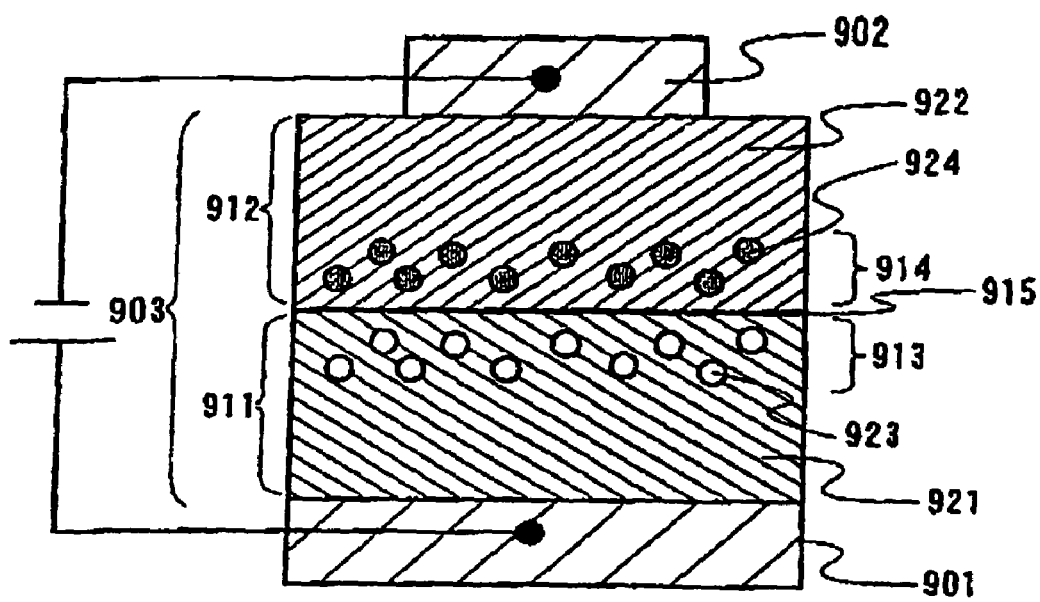
FIG. 9 is a diagram showing a basic structure of an existing organic light-emitting element.

Firstly, of an existing white organic light-emitting element that has two emission regions, that is, a first emission region and a second emission region a maximum peak of an emission spectrum of which is located in a longer wavelength side than the first emission region, an example of a basic configuration thereof is shown in FIG. 9.

FIG. 9 shows a structure of an organic light-emitting element in which a laminated structure (electroluminescent layer 903) of a hole transport layer 911 made of a hole transport material 921 and an electron transport layer 912 made of an electron-transporting material 922 is sandwiched between an anode 901 and a cathode 902. However, a first emission region 913 where a first dopant 923 is added to the hole transport layer 911 and a second emission region 914 where a second dopant 924 is added to the electron transport layer 912 are disposed. That is, the hole transport material 921 and the electron transport material 922 each work as a host material. Furthermore, both of the first emission region 913 and the second emission region 914 are present in the neighborhood of an interface 915 between the hole transport layer 911 and the electron transport layer 912.

In such a structure, a recombination region of carriers is in the neighborhood of the interface 915. Since in the neighborhood of the interface 915 two kinds of the first dopant 923 and the second dopant 924 are present together, emission processes are competed between the two kinds of dopants. At this time, when the two kinds of dopants are both fluorescent materials, since excitation lifetimes thereof are both similarly short, unless a Förster type energy transfer condition (an emission wavelength of any one of dopants overlaps with an absorption wavelength of another dopant) is sufficiently satisfied, both two kinds can emit. As a result, white emission can be realized.

For instance, though a structure of a white organic light-emitting element shown in non-patent literature 2 is one that is obtained by further adding another electron transport layer and electron injection layer in FIG. 9, a basic principle is similar. That is, in the hole transport layer 911 perylene that is a blue-emitting material is introduced as the first dopant 923 and in the electron transport layer 912 DCM1 that is an orange-emitting material is introduced as the second dopant 924, and thereby white emission is obtained.

On the other hand, the gist of the invention is to aim higher efficiency by introducing a reddish phosphorescent material in a white organic light-emitting element. However, even when a reddish phosphorescent material is introduced in the structure shown in FIG. 9 as the second dopant 924, white emission cannot be obtained. For instance, even when an element in which perylene that is a blue-emitting material is used as the first dopant 923 and as the second dopant 924 2, 3, 7, 8, 12, 13, 17, 18-octaethyl-21H, 23H-porphyrin-platinum complex (hereinafter abbreviated as PtOEP) that is a red phosphorescent material is used is prepared, only red emission of PtOEP is observed (described later in comparative example 1). This is explained as follows.

Firstly, in order to obtain white emission in the element structure, at least perylene that is the first dopant 923 has to emit. That is, a minimum condition is that a singlet excitation state of perylene emits light as it is.

However, as shown in FIG. 10A, without restricting to PtOEP, since many of phosphorescent materials are small in the ionization potential (a position of a HOMO level 1001 is high), it forms a deeper trap level to a hole. Accordingly, PtOEP traps a hole, and without exciting perylene, the PtOEP is likely to be directly excited.

Furthermore, many of the phosphorescent materials typical in PtOEP have a broad absorption band called a triplet MLCT in a visible light region (this corresponds to a lowest triplet excitation state of a phosphorescent material). In addition to this, in the case of the Förster type energy transfer, an energy transfer from a singlet excitation state of one molecule to a triplet excitation state of another molecule is allowed. This means that, as shown in FIG. 10B, even when a substance (perylene here) that has emission in a visible light region is excited, from the singlet excitation state $S_{D1}$ thereof to a triplet excitation state $T_{D2}$ of the phosphorescent material (PtOEP here), a Förster type energy transfer 1011 can easily occur. Accordingly, emission of perylene becomes difficult to observe. Here, though a triplet excitation state of perylene is not considered here, since perylene is a fluorescent material, the triplet excitation state thereof is deactivated or transfers energy to PtOEP.

Still furthermore, since the triplet MLCT absorption is generally wide in the band width, an energy transfer not only from a blue-emitting substance such as perylene but also even from a substance exhibiting greenish emission is induced. This phenomenon occurs not only in the case where a fluorescent material such as perylene is used as an emitting material in the first emission region but also similarly in the case where a phosphorescent material is used. Accordingly, a white organic light-emitting element in which a reddish phosphorescent material is introduced can be realized with difficulty.

A method of overcoming the problem is to make a distance between a first emission region and a second emission region more distant and thereby to inhibit an excitation state of the first emission region (singlet excitation state in particular) from being transferred to a triplet excitation state of the second emission region. An example of such a basic configuration of the invention is shown in FIG. 1.

Figure 1:
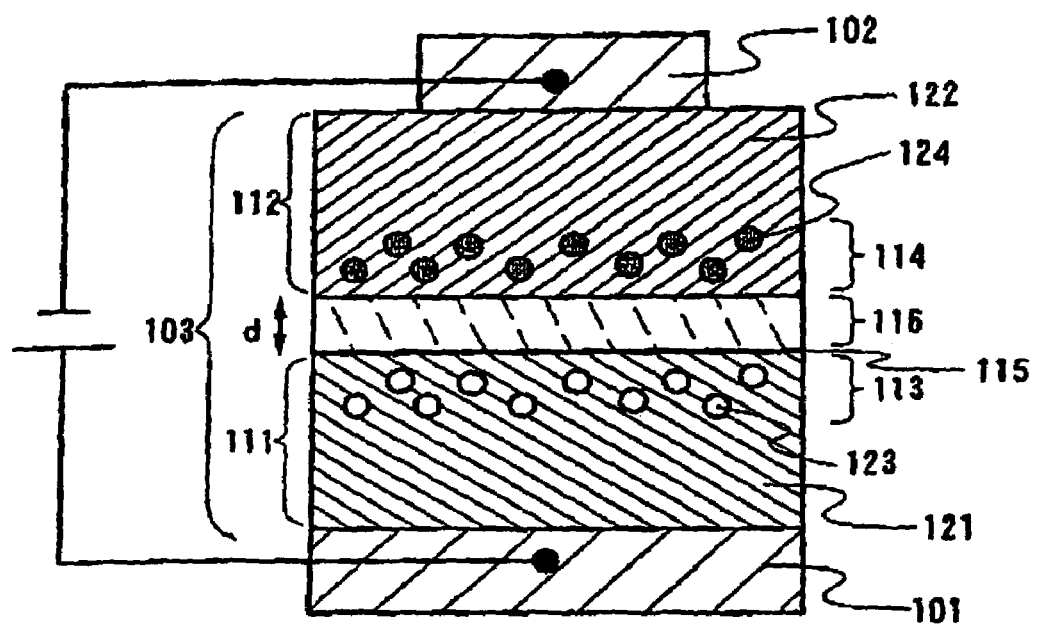
FIG. 1 is a diagram showing a basic structure of an organic light-emitting element according to the present invention.

In FIG. 1, a first dopant (fluorescent material here) 123 is added to a hole transport layer 111 that is made of a hole transport material 121 and thereby a first emission region 113 is formed. Furthermore, a second dopant (phosphorescent material) 124 is added to an electron transport layer 112 that is made of an electron transport material 122 and thereby a second emission region 114 is formed. As to emission wavelength, one of the second dopant (phosphorescent material) 124 is located toward a longer wavelength side than one of the first dopant 123. Furthermore, between the first emission region 113 and the second emission region 114, a layer 116 (hereinafter referred to as "gap layer") to which the second dopant (phosphorescent material) 124 is not added is disposed with a thickness of d, and this point is different from FIG. 9. Here the gap layer 116 is assumed to have the electron transportability. Still furthermore, reference numerals 101, 102 and 103, respectively, denote an anode, a cathode and an electroluminescent layer.

At this time, since the gap layer 116 has the electron transportability, a recombination region in the structure is in the neighborhood of an interface 115 between the first emission region 113 and the gap layer 116. Furthermore, as shown in FIG. 2A, owing to a distance d, a HOMO level 201 of the second dopant (phosphorescent material) does not directly trap a hole. Accordingly, firstly, the first dopant 123 is excited. As an excitation state, there area singlet excitation state $S_{D1}$ and a triplet excitation state $T_{D1}$.

Here, as shown in FIG. 2B, since owing to the gap layer 116 the first dopant and the second dopant (phosphorescent material) are apart by a distance d, the aforementioned Förster type energy transfer 211 of $S_{D1} \rightarrow T_{D2}$ contributes less (drastically diminishes as the distance d becomes larger). By just that much, $S_{D1} \rightarrow G_{D1}$, that is, emission of the first dopant $hv_{D1}$ becomes to be observed.

On the other hand, since the first dopant is a fluorescent material here, the triplet excitation state $T_{D1}$ cannot emit but can transfer energy to a triplet excitation state $T_{D2}$ of the second dopant (phosphorescent material). An excitation lifetime of a triplet excitation molecule is normally longer than that of a singlet excitation molecule and a diffusion distance thereof is large; accordingly, in comparison with the aforementioned energy transfer 211 of $S_{D1} \rightarrow T_{D2}$, an energy transfer 212 of $T_{D1} \rightarrow T_{D2}$ is affected less by a distance d. Accordingly, even when a distanced is separated to some extent, the energy transfer of $T_{D1} \rightarrow T_{D2}$ is effectively caused, subsequently, a triplet excitation state $T_{D2}$ of the second dopant (phosphorescent material) is speedily converted into emission $hv_{D2}$.

As described above, when the element structure according to the invention is applied, both the first dopant and the second dopant (phosphorescent material) that exhibits an emission in a longer wavelength side than the first dopant are allowed to emit; accordingly, white emission can be attained.

In the element structure shown in FIG. 1, in the second emission region, a phosphorescent material is used as a dopant; however, a phosphorescent material can be used singularly.

Furthermore, as a luminescent material in the first emission region, a phosphorescent material may be used; however, as shown in FIG. 1, a fluorescent material can be used preferably. In this case, a generated singlet excitation state and a generated triplet excitation state, respectively, contribute to emissions mainly in the first emission region and the second emission region; accordingly, both excitation states of the singlet and the triplet are allowed to contribute to emission and thereby an increase in the efficiency can be expected. Furthermore, an emission mechanism is understandable and an element can be easily designed.

Still furthermore, in the first emission region of the invention, without using a dopant, a layer that emits singularly may be applied. However, since the use of the dopant generally makes the emission efficiency higher, the dopant is preferably used as shown in FIG. 1. Furthermore, as mentioned above, since as a luminescent material in the first emission region a fluorescent material is preferable, it is the best to use a fluorescent material as the dopant in the first emission region. In that case, a plurality of kinds of dopants may be used.

The element configuration shown in FIG. 1 is one example of the invention and the element configuration, as far as it does not deviate from the gist of the invention, is not restricted thereto. For instance, in FIG. 1, a configuration in which in the hole transport layer 111 the second dopant (phosphorescent material) is doped, and in the electron transport layer 112 the first dopant is doped (that is, in this case, the second emission region becomes 113 and the first emission region becomes 114) may be formed. In this case, the gap layer 116 is necessarily constituted of a hole-transporting material and a recombination region of carriers is necessarily designed at an interface between the gap layer 116 and the electron transport layer 112.

Furthermore, though not shown in FIG. 1, between the anode 101 and the hole transport layer 111, a hole injection layer or a hole transport layer made of a hole transport material other than the hole transport material 121 may be inserted. Still furthermore, between the cathode 102 and the electron transport layer 112, an electron injection layer or an electron transport layer made of an electron transport material other than the electron transport material 122 may be inserted.

As mentioned above, the invention pays attention to a point that firstly an excitation state is formed in the first emission region and energy thereof is partially transferred to the second emission region. From such a viewpoint, like the structure shown in FIG. 1, the first emission region 113 is preferably designed more toward the anode than the second emission region 114. This is because when at this time a hole block layer made of a hole block material is applied as the gap layer 116, holes can be more effectively confined within the hole transport layer 111; accordingly, the recombination region of the carriers can be decided to the first emission region 113.

A value of ionization potential of the hole block material is preferably larger by 0.4 eV or more than a value of ionization potential of a substance that has the largest ionization potential of substances contained in the first emission region 113. Furthermore, when as shown in FIG. 1 the first emission region 113 has a dopant, it is important that substantially a value of the ionization potential of the hole block material that is used in the gap layer 116 is larger (preferably larger by 0.4 eV or more) than a value of the ionization potential of the hole transport material 121 that is a host in the first emission region.

When an element is designed thus, it becomes easy to form an excitation state in the first emission region firstly and to partially transfer energy thereof to the second emission region. However, in the next, a distance d that governs the energy transfer thereof is necessary to be decided.

Firstly, when d is set at 1 nm or more, since a Dexter type energy transfer (energy transfer due to exchange of the wave motion of an electron) can be inhibited from occurring and thereby an energy transfer mechanism becomes solely due to the Förster type energy transfer, the abovementioned principle can be applied. Furthermore, when d is set at substantially 30 nm, even the energy transfer due to $T_{D1} \rightarrow T_{D2}$ described in FIG. 2B tends to decrease much. Accordingly, the d is preferably in the range of 1 nm or more and 30 nm or less.

However, in order to inhibit the phosphorescent material in the second emission region from directly trapping the holes (FIG. 2A), the d is preferably set at 5 nm or more. Furthermore, a proper distance that makes the contribution of the energy transfer 211 of $S_{D1} \rightarrow T_{D2}$ in FIG. 2B smaller and further sufficiently causes the energy transfer 212 of $T_{D1} \rightarrow T_{D2}$ is substantially 5 to 20 nm. Accordingly, the d is more preferably 5 nm or more and 20 nm or less.

In the above, a principle that according to the present invention a white organic light-emitting element in which a reddish phosphorescent material is introduced can be realized was described. In the next place, a wavelength range preferable for obtaining a high-quality white emission color will be illustrated.

Firstly, an emission spectrum in the first emission region has at least one peak in a region of 400 nm or more and 500 nm or less or at least two peaks in a region of 400 nm or more and 560 nm or less. When this is combined with an emission color of a reddish phosphorescent material in the second emission region, white light can be realized. At this time, an emission spectrum of the phosphorescent material has only to be reddish, that is, to have at least one peak in a region of 560 nm or more and 700 nm or less.

Furthermore, when for instance a first dopant that is capable of exhibiting the excimer emission is added to the first emission region, by optimizing a doping concentration, emission intrinsic to the first dopant and excimer emission thereof are allowed to simultaneously emit. Since the excimer emission is necessarily located on a longer wavelength side than the intrinsic emission, two emission peaks can be extracted from one substance. When this phenomenon and a reddish emission color in the second emission region are combined, an emission spectrum having peaks in the respective wavelength regions of R, G and B can be realized.

In what follows, materials that can be used in the invention will be specifically illustrated. However, materials that can be applied to the invention are not restricted thereto.

As a hole injection material that is used in a hole injection layer, porphyrin base compounds are effective among organic compounds; that is, phthalocyanine (abbreviated as $H_2$-Pc), copper phthalocyanine (abbreviated as Cu-Pc) and so on can be used. Furthermore, there are materials obtained by applying the chemical doping to conductive polymers; that is, polyethylene dioxythiophene (abbreviated as PEDOT), polyaniline (abbreviated as PAni) and polyvinyl carbazole (abbreviated as PVK) that are doped with polystyrene sulfonic acid (abbreviated as PSS) can be used. Still furthermore, very thin films of inorganic insulators such as vanadium pentoxide and aluminum oxide are effective as well.

As a hole transport material for using a hole transporting layer, aromatic amine (that is, the one having a benzene ring-nitrogen bond) compounds are preferably used. For example, N,N'-bis(3-methylphenyl)-N,N'-diphenyl-1,1'-biphenyl-4,4'-diamine(abbreviated TPD) or derivatives thereof such as 4,4'-bis[N-(1-naphthyl)-N-phenyl-amino]-biphenyl (hereafter, referred to as α-NPD) is widely used. Also used are star burst aromatic amine compounds, including: 4,4',4"-tris(N,N-diphenyl-amino)-triphenyl amine (hereafter, referred to as TDATA); and 4,4',4"-tris[N-(3-methylphenyl)-N-phenyl-amino]-triphenyl amine (hereafter, referred to as "MTDATA").

As electron transport materials for forming an electron transporting layer, in specific, metal complexes such as tris(8-quinolinolate) aluminum (abbreviated Alq$_3$), tris(4-methyl-8-quinolinolate) aluminum (abbreviated Almq$_3$), bis (10-hydroxybenzo[h]-quinolinato) beryllium (abbreviated BeBq$_2$), bis(2-methyl-8-quinolinolate)-(4-hydroxy-biphenylyl)-aluminum (abbreviated BAlq), bis [2-(2-hydroxyphenyl)-benzooxazolate]zinc (abbreviated Zn(BOX)$_2$), and bis [2-(2-hydroxyphenyl)-benzothiazolate] zinc (abbreviated Zn(BTZ)$_2$). Besides, oxadiazole derivatives such as 2-(4-biphenyl)-5-(4-tert-butylphenyl)-1,3,4-oxadiazole (abbreviated PBD), and 1,3-bis[5-(p-tert-butylphenyl)-1,3,4-oxadiazole-2-yl]benzene (abbreviated OXD-7); triazole derivatives such as 3-(4-tert-butylphenyl)-4-phenyl-5-(4-biphenylyl)-1,2,4-tri azole (abbreviated TAZ) and 3-(4-tert-butylphenyl)-4-(4-ethylphenyl)-5-(4-biphenylyl)-1,2,4-triazole (abbreviated p-EtTAZ); imidazol derivatives such as 2,2',2''-(1,3,5-benzenetryil)tris[1-phenyl-1H-benzimidazole] (abbreviated TPBI); and phenanthroline derivatives such as bathophenanthroline (abbreviated BPhen) and bathocuproin (abbreviated BCP) can be used in addition to metal complexes.

Furthermore, as hole block materials that are useful as the materials for the abovementioned gap layer, abovementioned BAlq, OXD-7, TAZ, p-EtTAZ, TPBI, BPhen and BCP can be used.

Still furthermore, as the luminescent materials in the first emission region, fluorescent materials having the hole transportability such as abovementioned TPD and α-NPD and fluorescent materials having the electron transportability such as Alq$_3$, Almq$_3$, BeBq$_2$, BAlq, Zn(BOX)$_2$ and Zn(BTZ)$_2$ may be used. Furthermore, various kinds of fluorescent dyes such as quinacridone, N,N'-dimethyl quinacridone, perylene, fluoranthene, and cumarine base dyes (such as cumarone 6) can be cited as dopant. Still furthermore, phosphorescent materials such as tris(2-phenylpyridine)iridium (abbreviated as Ir(ppy)$_3$) can be cited. All these exhibit an emission peak in 400 nm or more and 560 nm or less; accordingly, these can be preferably used as a luminescent material in the first emission region.

On the other hand, as a luminescent material in the second emission region, an organometallic complex having iridium or platinum as a central metal is effective. Specifically, other than the abovementioned PtOEP, bis(2-(2'-benzothienyl)pyridinato-N, C$^{3'}$) (acetylacetonato)iridium (abbreviated as btp$_2$Ir(acac)), bis(2-(2'-thienyl)pyridinato-N, C$^{3'}$ (acetylacetonato)iridium (abbreviated as thp$_2$Ir(acac)) and bis(2-(1-naphthyl)benzooxazolato-N, C$^{2'}$ (acetylacetonato)iridium (abbreviated as bon$_2$Ir(acac)) can be cited. All these are phosphorescent materials having a reddish (560 nm or more and 700 nm or less) emission peak and suitable as a luminescent material in the second emission region according tot the invention.

In the case of a dopant being used in the first emission region or the second emission region, as a host material thereof, a hole transport material or an electron transport material typical in the abovementioned examples can be used. Furthermore, a bipolar material such as 4, 4'-N,N'-dicarbazolyl-biphenyl (abbreviated as CBP) can be used.

Furthermore, in the invention, a lamination method of the respective layers in an organic light-emitting element is not restricted to particular one. As far as the lamination can be carried out, whatever method of vacuum deposition method, spin coat method, ink jet method and dip coat method can be selected.

EXAMPLES

Example 1

Figure 3:
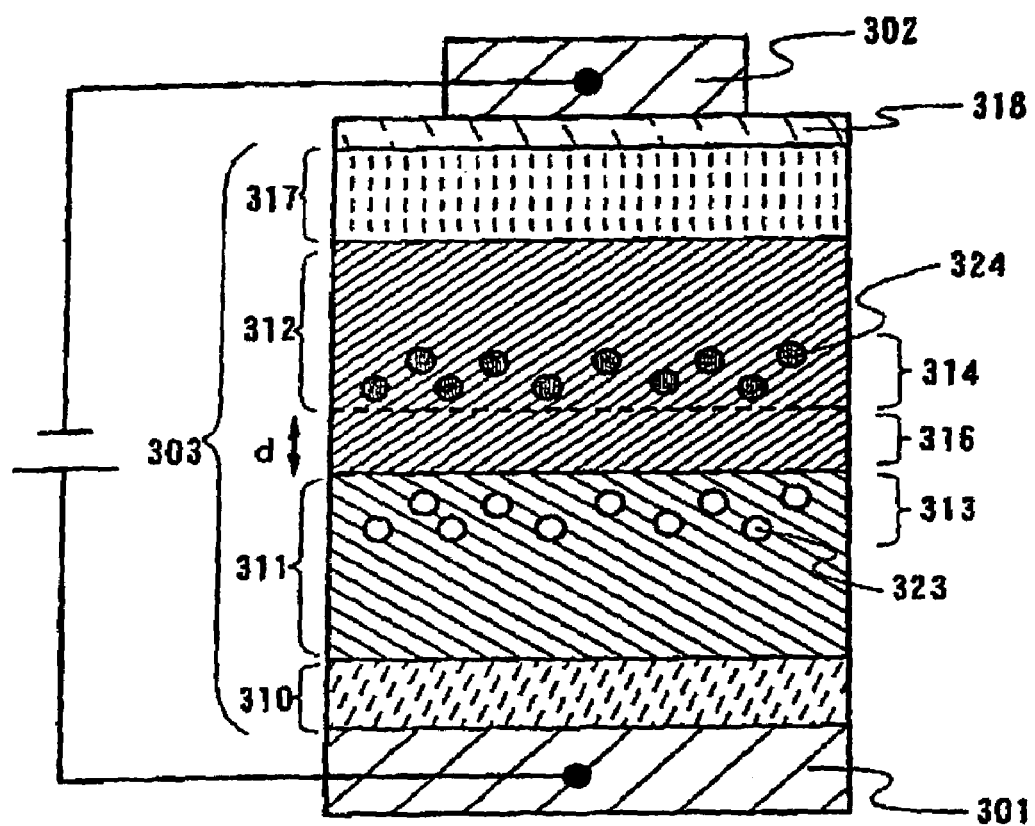
FIG. 3 is a diagram showing a specific element structure of the organic light-emitting element according to the invention (examples 1 through 3).

In the present example, an organic light-emitting element according to the invention and having a gap layer thickness d of 10 nm will be specifically illustrated with reference to FIG. 3. In FIG. 3, reference numerals 301, 302 and 303, respectively, denote an anode, a cathode and an electroluminescent layer.

Firstly, on a glass substrate on which ITO that is an anode 301 was deposited with a thickness of substantially 100 nm, CuPc that is a hole transport material was deposited with a thickness of 20 nm, and thereby a hole injection layer 310 was formed. Subsequently, α-NPD that is a hole transport material was deposited with a thickness of 30 nm, and thereby a hole transport layer 311 was formed. In the last 10 nm thereof, α-NPD (host material) and perylene (guest material) that is a singlet emission material were co-deposited so as to be substantially 99:1 in the ratio thereof (weight ratio). That is, at a concentration of substantially 1 weight percent, perylene is dispersed in α-NPD. This co-deposited layer of 10 nm is a first emission region 313.

After the first emission region 313 was formed, BAlq that is a hole block material (and an electron transport material) was deposited with a thickness of 10 nm, and thereby a gap layer 316 was formed. BAlq was further deposited with a thickness of 30 nm as an electron transport layer 312. In the first 10 nm thereof, a region to which a phosphorescent material PtOEP was added was co-deposited to form. An addition amount was controlled so that in BAlq PtOEP may be dispersed at a concentration of substantially 7.5 weight percent. This becomes a second emission region 314. Thus, a layer that uses BAlq becomes in sum total 40 nm in a combination of the gap layer 316 and the electron transport layer 312.

In the next place, Alq that is an electron transport material was deposited with a thickness of 20 nm and thereby a second electron transport layer 317 was formed. Thereafter, as an electron injection layer 318, 2 nm of calcium fluoride (abbreviated as CaF$_2$) was deposited, finally followed by depositing 150 nm of Al as a cathode. Thereby, an organic light-emitting element according to the invention can be obtained.

The characteristics of the organic light-emitting element manufactured according to example 1 were as follows. That is, when the brightness was set at 10 [cd/m$^2$], a driving voltage was 8.0 [V] and a current efficiency was 4.7 [cd/A].

Figure 4:
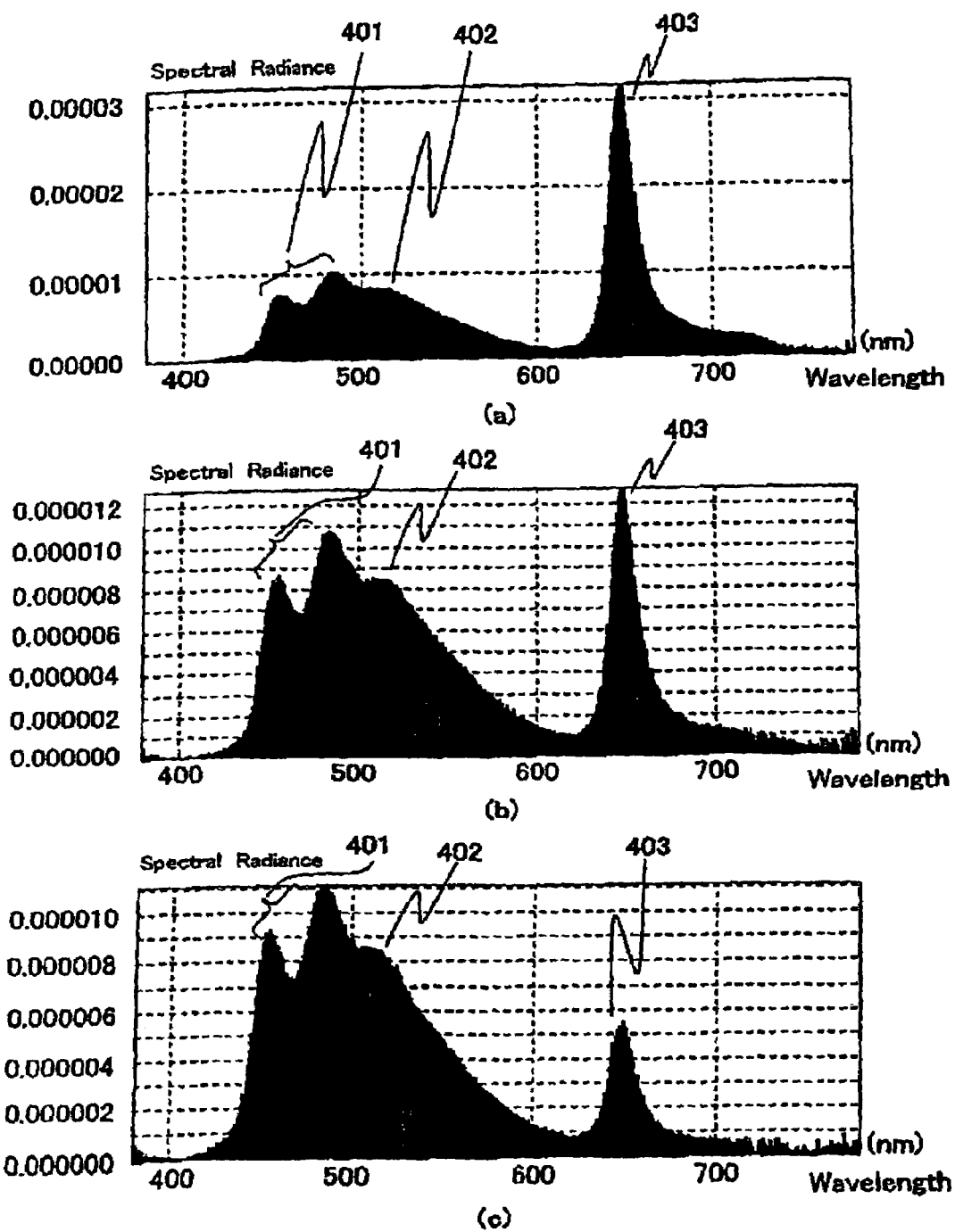
FIGS. 4A through 4C are diagrams showing emission spectra of organic light-emitting elements in examples 1 through 3.

An emission spectrum when the brightness is 10 [cd/m$^2$] is shown in FIG. 4A. A blue emission spectrum 401 intrinsic to perylene and a green spectrum 402 due to the excimer emission of perylene, respectively, were clearly observed in the neighborhood of 460 nm and 480 nm and in the neighborhood of 520 nm. Furthermore, in the neighborhood of 650 nm, a sharp red peak 403 due to PtOEP was observed.

Thus, in the example 1, an organic light-emitting element that uses a reddish phosphorescent material and has peaks in the respective wavelength regions of R, G and B could be realized. The CIE color coordinates were (x, y)=(0.30, 0.35), and it was white emission to the eye.

As mentioned above, it is considered that in the example 1, the energy transfer of $S_{D1} \rightarrow T_{D2}$ shown in FIG. 2B is suppressed to some extent and thereby both perylene and PtOEP are allowed to emit.

Ionization potentials of α-NPD that was used in the hole transport layer 311 and BAlq that was used in the gap layer 316 were measured (in a thin film state by use of a photoelectron spectrometer AC-2 manufactured by Riken Keiki Co., Ltd.) and found to be 5.3 [eV] for α-NPD and 5.7 [eV] for BAlq. That is, it is considered that owing to difference of substantially 0.4 [eV] in the ionization potentials of both, BAlq effectively blocks holes and controls the recombination region of carriers within the hole transport layer 311 (or in the first emission region 313).

Example 2

In the present example, an organic light-emitting element according to the invention and having a gap layer thickness d of 20 nm will be specifically illustrated with reference to FIG. 3.

Firstly, the first emission region 313 is formed similarly to example 1. After the first emission region 313 is formed, BAlq that is a hole block material (and an electron transport material) was deposited with a thickness of 20 nm and thereby a gap layer 316 was formed. BAlq was further deposited with a thickness of 20 nm as an electron transport layer 312. In the first 10 nm thereof, a region to which a phosphorescent material PtOEP was added was co-deposited to form. An addition amount was controlled so that in BAlq PtOEP may be dispersed at a concentration of substantially 7.5 weight percent. This becomes a second emission region 314. Thus, a layer that uses BAlq becomes in sum total 40 nm in combination of the gap layer 316 and the electron transport layer 312.

In the next place, Alq that is an electron transport material was deposited with a thickness of 20 nm, and thereby a second electron transport layer 317 was formed. Thereafter, as an electron injection layer 318, 2 nm of $CaF_2$ was deposited, finally followed by depositing 150 nm of Al as a cathode. Thereby, an organic light-emitting element according to the invention can be obtained.

The characteristics of the organic light-emitting element manufactured according to example 2 were as follows. That is, when the brightness was set at 10 $[cd/m^2]$, a driving voltage was 8.6 [V] and a current efficiency was 4.6 [cd/A].

An emission spectrum when the brightness is set at 10 $[cd/m^2]$ is shown in FIG. 4B. A blue emission spectrum 401 intrinsic to perylene and a green spectrum 402 due to excimer emission of perylene, respectively, were clearly observed in the neighborhood of 460 nm and 480 nm and in the neighborhood of 520 nm. Furthermore, in the neighborhood of 650 nm, a sharp red peak 403 due to PtOEP was observed.

Thus, also in the example 2, an organic light-emitting element that uses a reddish phosphorescent material and has peaks in the respective wavelength regions of R, G and B could be realized. The CIE color coordinates were (x, y)=(0.25, 0.36), and it was bluish white emission to the eye.

As mentioned above, it is considered that in the example 2, the energy transfer of $S_{D1} \rightarrow T_{D2}$ shown in FIG. 2B is substantially completely suppressed and thereby both perylene and PtOEP were allowed to emit.

Example 3

In the present example, an organic light-emitting element according to the invention and having a gap layer thickness d of 30 nm will be specifically illustrated with reference to FIG. 3.

Firstly, the first emission region 313 is formed similarly to examples 1 and 2. After the first emission region 313 was formed, BAlq that is a hole block material (and an electron transport material) was deposited with a thickness of 30 nm, and thereby a gap layer 316 was formed. Furthermore, as a second emission region 314, a region where a phosphorescent material PtOEP was added to BAlq was co-deposited with a thickness of 10 nm. An addition amount was controlled so that in BAlq PtOEP may be dispersed at a concentration of substantially 7.5 weight percent. Thus, a layer that uses BAlq becomes in sum total 40 nm in combination of the gap layer 316 and the second emission region 314. In the example, after the second emission region 314, BAlq is not further formed as an electron transport layer 312 (this is because a film thickness of layers that use BAlq is made 40 nm similarly to examples 1 and 2).

In the next place, Alq that is an electron transport material was deposited with a thickness of 20 nm and thereby a second electron transport layer 317 was formed. Thereafter, as an electron injection layer 318, 2 nm of $CaF_2$ was deposited, finally followed by depositing 150 nm of Al as a cathode. Thereby, an organic light-emitting element according to the invention can be obtained.

The characteristics of the organic light-emitting element manufactured according to example 3 were as follows. That is, when the brightness was set at 10 $[cd/m^2]$, a driving voltage was 8.2 [V] and a current efficiency was 4.6 [cd/A].

An emission spectrum when the brightness is set at 10 $[cd/m^2]$ is shown in FIG. 4C. A blue emission spectrum 401 intrinsic to perylene and a green spectrum 402 due to excimer emission of perylene, respectively, were clearly observed in the neighborhood of 460 nm and 480 nm and in the neighborhood of 520 nm. Furthermore, in the neighborhood of 650 nm, though a little weak, a sharp red peak 403 due to PtOEP was also observed.

Thus, also in the example 3, an organic light-emitting element that uses a red phosphorescent material and has peaks in the respective wavelength regions of R, G and B could be realized. The CIE color coordinates were (x, y)=(0.22, 0.35), and it was bluish blue-white to the eye.

As mentioned above, it is considered that in the example 3, the energy transfer of $S_{D1} \rightarrow T_{D2}$ shown in FIG. 2B was substantially completely suppressed and furthermore, in comparison with examples 1 and 2, the energy transfer due to $T_{D1} \rightarrow T_{D2}$ was also attenuated; as a result, emission of perylene became stronger and emission of PtOEP became weaker. Accordingly, the thickness d of the gap layer according to the invention can be said to be preferable up to substantially 30 nm.

Comparative Example 1

Figure 11:
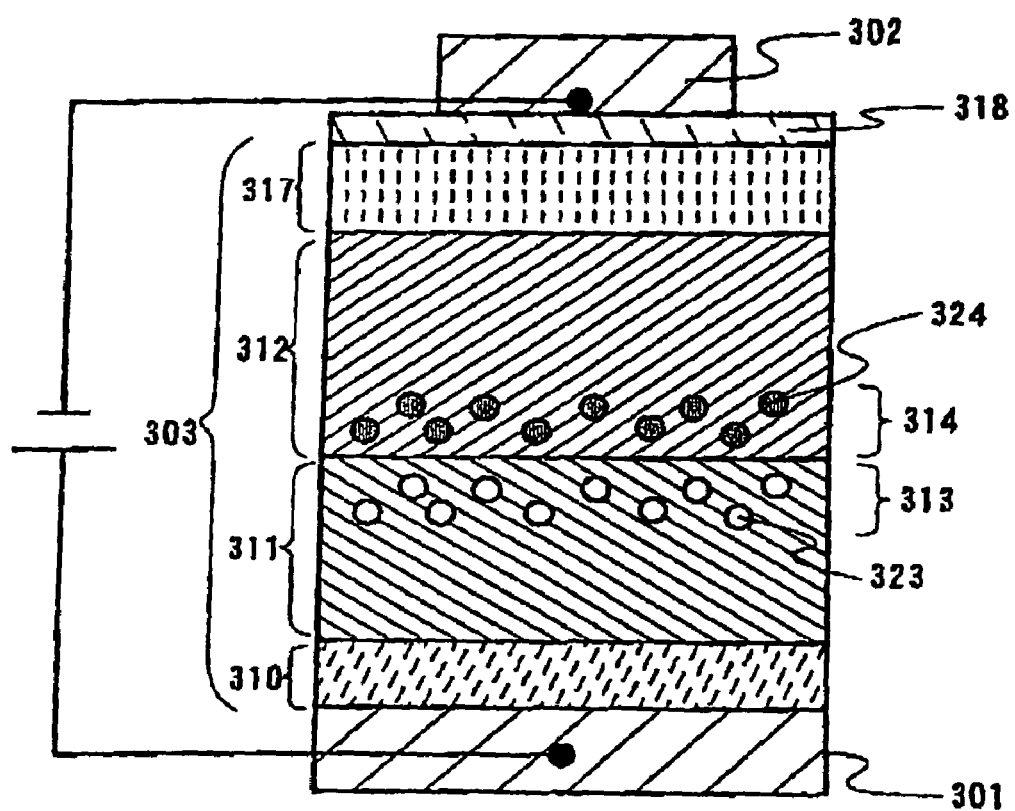
FIG. 11 is a diagram showing a specific element structure of the existing organic light-emitting element (comparative example 1).

In the present comparative example, an existing organic light-emitting element in which a gap layer is not disposed will be specifically illustrated with reference to FIG. 11. In FIG. 11, reference numerals and so on in FIG. 3 are quoted.

Firstly, s first emission region 313 is formed similarly to examples 1 through 3. After the first emission region 313 was formed, as an electron transport layer 312 BAlq was deposited with a thickness of 40 nm. In the first 10 nm thereof, a second emission region 314 to which a phosphorescent material PtOEP is added with BAlq as a host was formed. An addition amount was controlled so that PtOEP may be dispersed in BAlq at a concentration of substantially 7.5 weight percent.

Subsequently, an electron transport material Alq was deposited with a thickness of 20 nm and thereby a second electron transport layer 317 was formed. Thereafter, as an electron injection layer 317, 2 nm of $CaF_2$ was deposited, followed by finally depositing Al with a thickness of 150 nm as a cathode.

The characteristics of the organic light-emitting element manufactured according to the comparative example were as follows. That is, when the brightness was set at 10 $[cd/m^2]$, a driving voltage was 8.8 [V] and a current efficiency was 1.9 [cd/A].

Figure 12:
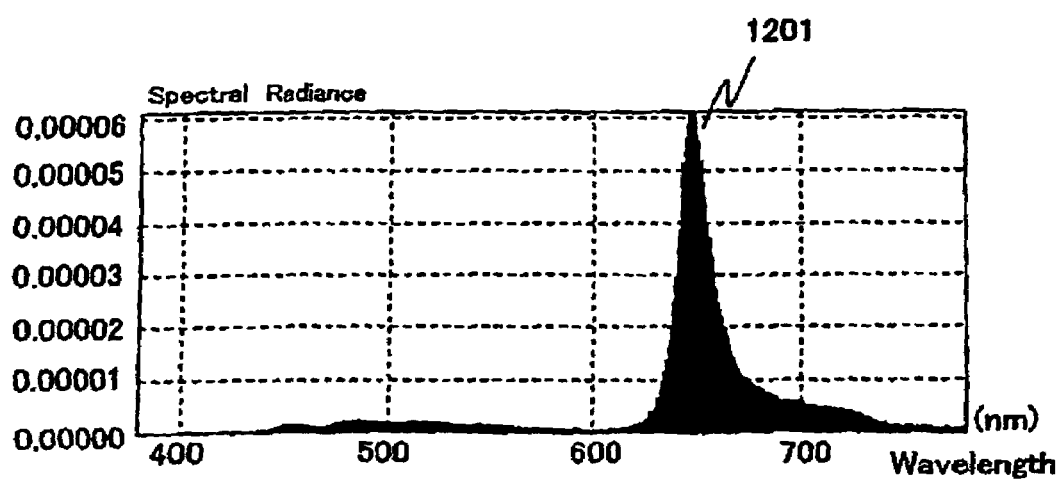
FIG. 12 is a diagram showing an emission spectrum of the organic light-emitting element in comparative example 1.

An emission spectrum when the brightness is set at 10 [cd/m$^2$] is shown in FIG. 12. In the comparative example, an emission spectrum of perylene was hardly observed and only a sharp red peak 1201 due to PtOEP in the neighborhood of 650 nm was observed. Furthermore, the CIE color coordinates were (x, y)=(0.51, 0.33), and it was nearly red to the eye.

As shown with the above comparative example, it is found that according to the existing element structure in which a gap layer according to the invention is not disposed, a white organic light-emitting element to which a reddish phosphorescent material is applied is difficult to realize.

Example 4

In the present example, a light-emitting device that has an organic light-emitting element according to the invention in a pixel portion will be explained with reference to FIGS. 5A and 5B. FIG. 5A is a top view showing a light-emitting device and FIG. 5B is a sectional view obtained by cutting FIG. 5A along A–A'. Reference numerals 501, 502 and 503, respectively, denote a driving circuit portion (source side driving circuit), a pixel portion and a driving circuit portion (gate side driving circuit). Furthermore, reference numerals 504 and 505, respectively, denote a sealing substrate and a sealing agent, and the inside 507 surrounded by the sealing agent 505 is a space.

Reference numeral 508 denotes a connection wiring for transmitting a signal that is input to the source side driving circuit 501 and the gate side driving circuit 503 and the connection wiring 508 receives from an FPC (flexible printed circuits) 509 that becomes an external input terminal a video signal, a clock signal, a start signal and a reset signal. In the drawing, only an FPC is shown; however, to the FPC a printed wiring board (PWB) may be attached. In the light-emitting device in the present specification, not only the light-emitting device body but also a state where an FPC or PWB is attached thereto is included.

In the next place, a sectional structure will be explained with reference to FIG. 5B. On a substrate 510, a driving circuit portion and a pixel portion are formed. In the drawing, the source side driving circuit 501 that is a driving circuit portion and the pixel portion 502 are shown.

In the source side driving circuit 501, a CMOS circuit in which an n-channel type TFT 523 and a p-channel type TFT 524 are combined is formed. Furthermore, a TFT that forms a driving circuit may be formed with a known CMOS circuit, PMOS circuit or NMOS circuit. Furthermore, in the present embodiment, a driver-integrated type in which a driving circuit is formed on a substrate is shown; however, the driving circuit is not necessarily formed on a substrate but may be formed outside thereof.

Furthermore, the pixel portion 502 is formed of a plurality of pixels including a switching TFT 511, a current control TFT 512 and a first electrode 513 electrically connected to a drain thereof. An insulator 514 is formed covering an end portion of the first electrode 513. Here, a positive photosensitive acrylic resin film is used to form.

In order to improve the coverage, a curved surface having a curvature is formed at an upper end or lower end of the insulator 514. For instance, in the case of a positive photosensitive acryl being used as a material of the insulator 514, it is preferable to give a curved surface having a radius of curvature (0.2 to 3 μm) only to the upper end portion of the insulator 514. As the insulator 514, any one of a negative type that becomes insoluble to an etchant owing to photosensitive light and a positive type that becomes soluble to an etchant owing to light can be used.

On the first electrode 513, an electroluminescent layer 515 and a second electrode 516 are formed. As a material that is used for the first electrode 513 that works as an anode, it is preferable to use a material large in the work function. For instance, other than single layer films such as an ITO (indium tin oxide) film, indium zinc oxide (IZO) film, titanium nitride film, chromium film, tungsten film, Zn film and Pt film, a laminate of titanium nitride and a film mainly made of aluminum and a three-layered structure of a titanium nitride film, a film mainly made of aluminum and a titanium nitride film can be used. When a laminate structure is taken, the laminate is low in the resistance as a wiring, can establish good ohmic contact, and is allowed to function as an anode. Here, as the first electrode 513, ITO is used, and a structure where light is taken out of a substrate 510 side is adopted.

The electroluminescent layer 515 is formed by means of a vapor deposition method with a deposition mask or an ink jet method. To the electroluminescent layer 515, an electroluminescent layer having a structure disclosed in the invention has only to be applied. Specifically, configurations of the electroluminescent layer shown in examples 1 through 3 can be used. Furthermore, as materials that are used in the electroluminescent layer, normally, in many cases, organic compounds are used in a single layer or laminated layer; however, in the invention, a configuration in which in a film made of an organic compound an inorganic compound is partially used is also included.

Furthermore, as materials that are used for the second electrode (cathode) 516 that is formed on the electroluminescent layer 515, materials small in the work function (such as Al, Ag, Li, Ca or alloys thereof such as MgAg, MgIn, AlLi, CaF$_2$ or CaN) have only to be used. In the case of light generated in the electroluminescent layer 515 being allowed transmitting through the second electrode 516, as the second electrode (cathode) 516, a laminate of a metal thin film of which film thickness is made thin and a transparent conductive film (such as ITO, IZO, and zinc oxide (ZnO)) may be used. Here, by use of anon-transmissive film of Al, a light-emitting device having a bottom emission type structure in which light is extracted only from the substrate 510 side is formed.

With the sealing agent 505, a sealing substrate 504 and an element substrate 510 are adhered, and thereby in a space 507 surrounded by the substrate 501, the sealing substrate 504 and the sealing agent 505, the organic light-emitting element 517 according to the invention is housed. In the space 507, other than a case where an inert gas (such as nitrogen or argon) is filled, a configuration that is filled with the sealing agent 505 is also included.

As the sealing agent 505, epoxy base resins can be preferably used. Furthermore, these materials are preferable to be ones that are not permeable to moisture and oxygen as far as possible. As materials that are used for the sealing substrate 504, other than a glass substrate or quartz substrate, a plastics substrate made of such as an FRP (Fiberglass-Reinforced Plastics), PVF (polyvinyl fluoride), mylar, polyester or acryl can be used.

Thus, a light-emitting device having the organic light-emitting element according to the invention can be obtained.

Example 5

Figure 5:
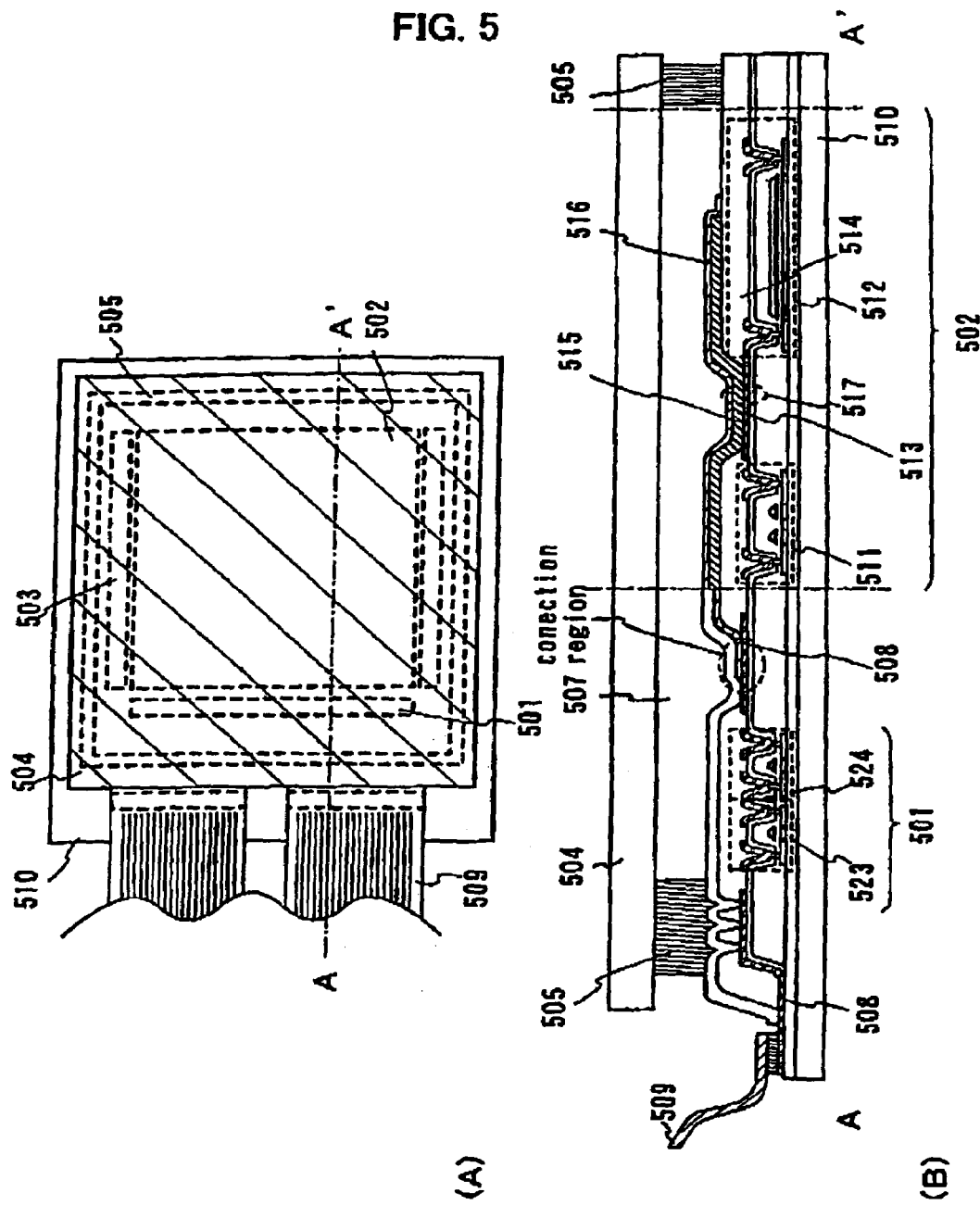
FIGS. 5A and 5B are schematic diagrams of the light-emitting device according to the invention (example 4).
Figure 6:
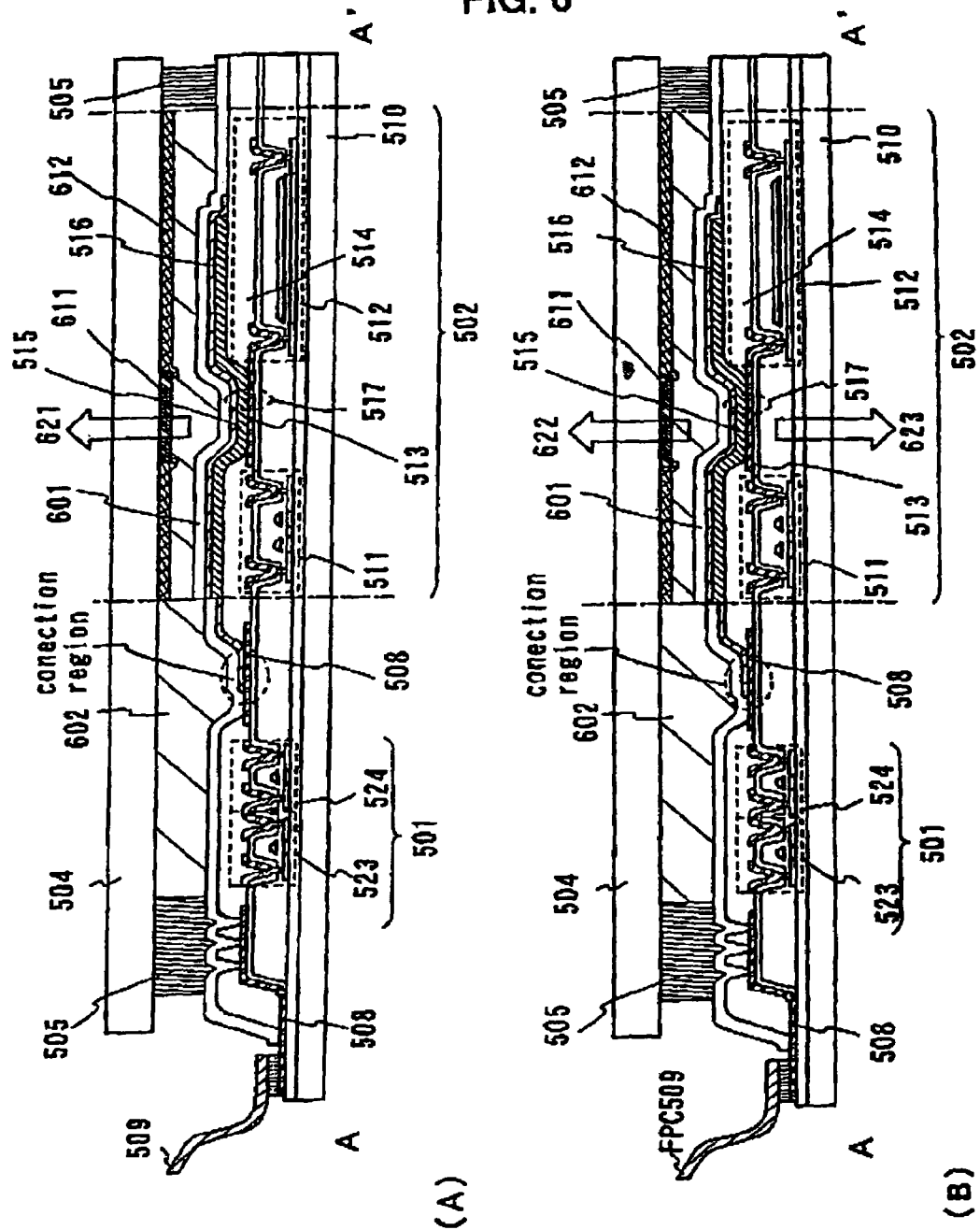
FIGS. 6A and 6B are schematic diagrams of the light-emitting device according to the invention (examples 5 and 6).

In the present example, in a light-emitting device shown in FIG. 5, a light-emitting device having a top emission type structure in which light is extracted from the sealing substrate 504 side will be specifically illustrated. A schematic diagram thereof (sectional view) is shown in FIG. 6A. In FIG. 6A, reference numerals of FIG. 5 are quoted. A direction of emission is shown with 621 in FIG. 6A.

In FIG. 6A, the first electrode 513 and the second electrode, respectively, are made a light-shielding anode and a translucent cathode, and thereby a top emission structure is formed. Accordingly, as the first electrode, other than single layer films such as a titanium nitride film, chromium film, tungsten film, Zn film and Pt film, a laminate of titanium nitride and a film mainly made of aluminum, and a three-layered structure of a titanium nitride film, a film mainly made of aluminum and a titanium nitride film can be used. As the second electrode, a laminate structure of a metal thin film of which film thickness is made thin and a transparent conductive film (such as ITO, IZO and ZnO) has only to be used. Here, as the first electrode and the second electrode, a titanium nitride film and a laminate structure of a thin film of Mg:Ag alloy and ITO are used respectively.

Furthermore, in the light-emitting device according to the example, in order to make the light-emitting device a full color device with the white organic light-emitting element 517 according to the invention, a color filter (for sake of simplicity, here, an overcoat layer is not shown in the drawing) made of a colored layer 611 and a light-shielding layer (BM) 612 is disposed.

Furthermore, in order to seal the organic light-emitting element 517, a transparent protective layer 601 is formed. As the transparent protective layer 601, an insulating film mainly made of silicon nitride or silicon oxide nitride obtained by means of a sputtering method (such as DC process or RF process) or a PCVD method, a thin film mainly made of carbon (such as a diamond-like carbon (DLC) film, or carbon nitride: CN film), or a laminate thereof can be preferably used. When a silicon nitride film is formed with a silicon target and in an atmosphere that contains nitrogen and argon, a silicon nitride film high in the blocking effect to impurities such as moisture and an alkali metal can be obtained. Alternatively, a silicon nitride target may be used. Furthermore, the transparent protective layer may be formed with a deposition device that uses remote plasma. Still furthermore, in order to allow light going through the transparent protective layer, a film thickness of the transparent protective layer is preferably as thin as possible.

Here, in order to further seal the organic light-emitting element 517, by use of not only the sealing agent 505 but also a second sealing agent 602, the space 507 in FIG. 5 is filled and adhered with the sealing substrate 504. The sealing operation may be conducted under an inert gas atmosphere. Also as to the second sealing agent 505, similarly to the sealing agent 505, an epoxy base resin can be preferably used.

Example 6

In the present example, in the light-emitting device shown in FIG. 5, a light-emitting device having a double-sided emission type structure in which from both of a substrate 510 side and a sealing substrate 504 side light is extracted will be specifically illustrated. A schematic diagram (sectional view) thereof is shown in FIG. 6B. In FIG. 6B, reference numerals of FIG. 5 will be quoted. Directions of emission are as shown with 622 and 623 in FIG. 6B.

In FIG. 6B, a basic structure thereof is similar to that of FIG. 6A. However, it is different from FIG. 6A in that as the first electrode 513 a transparent conductive film such as an ITO film or an IZO film is used. Here, by the use of an ITO film, a light-emitting device having a double-sided emission type structure can be realized.

In FIG. 6B, on the substrate 510 side a color filter is not disposed; however, by disposing a color filter also on this side, both surfaces each may be provided with a color filter. In this case, a color filter formed on the substrate 510 side may be disposed according to a process similar to that used in an existing liquid crystal display device or the like.

Example 7

In the present example, various electric appliances that are completed by use of a light-emitting device having an organic light-emitting element according to the invention will be explained.

Figure 7:
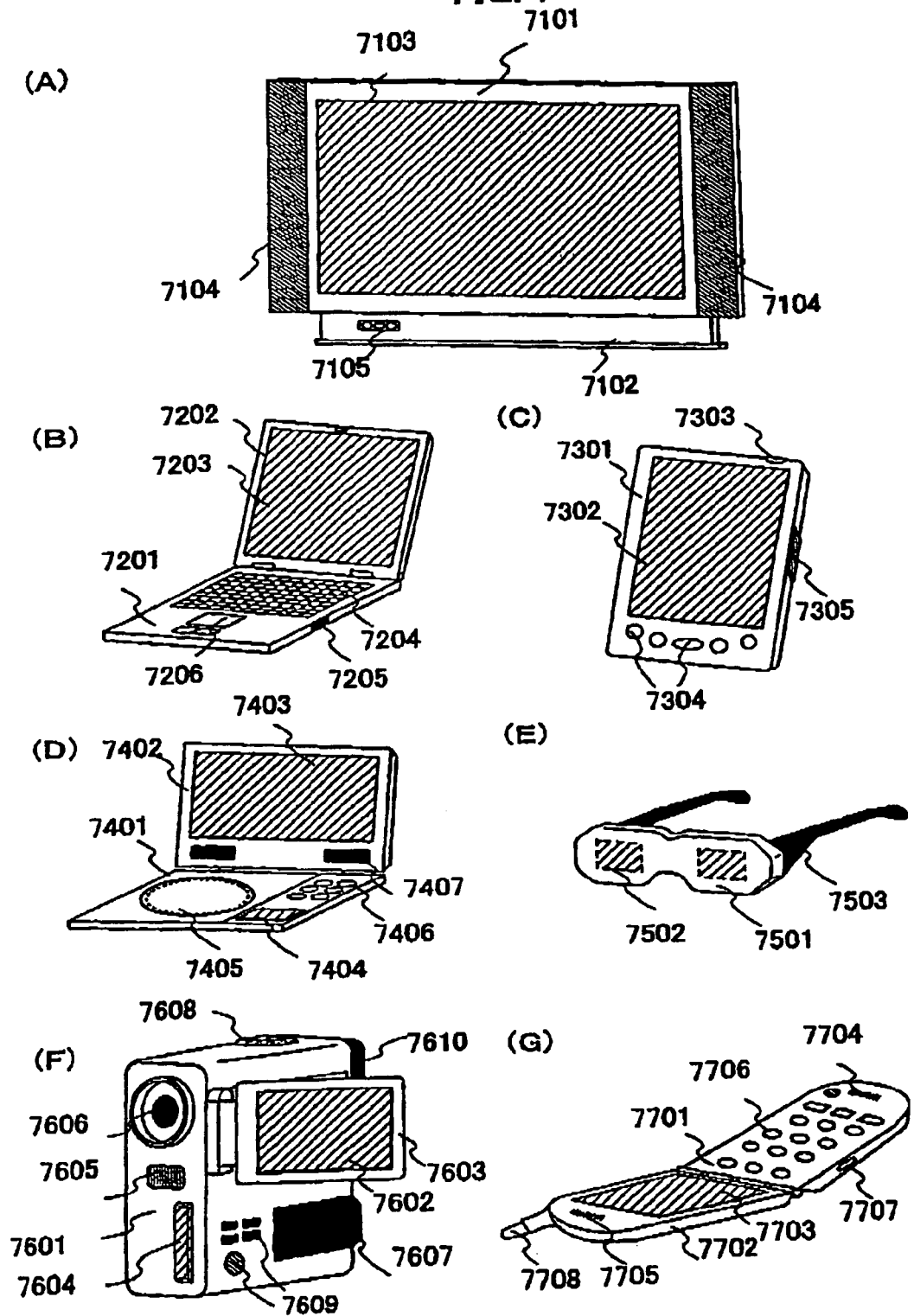
FIGS. 7A through 7G are diagrams showing examples of electric appliances that use the light-emitting device according to the invention (example 7).
Figure 8:
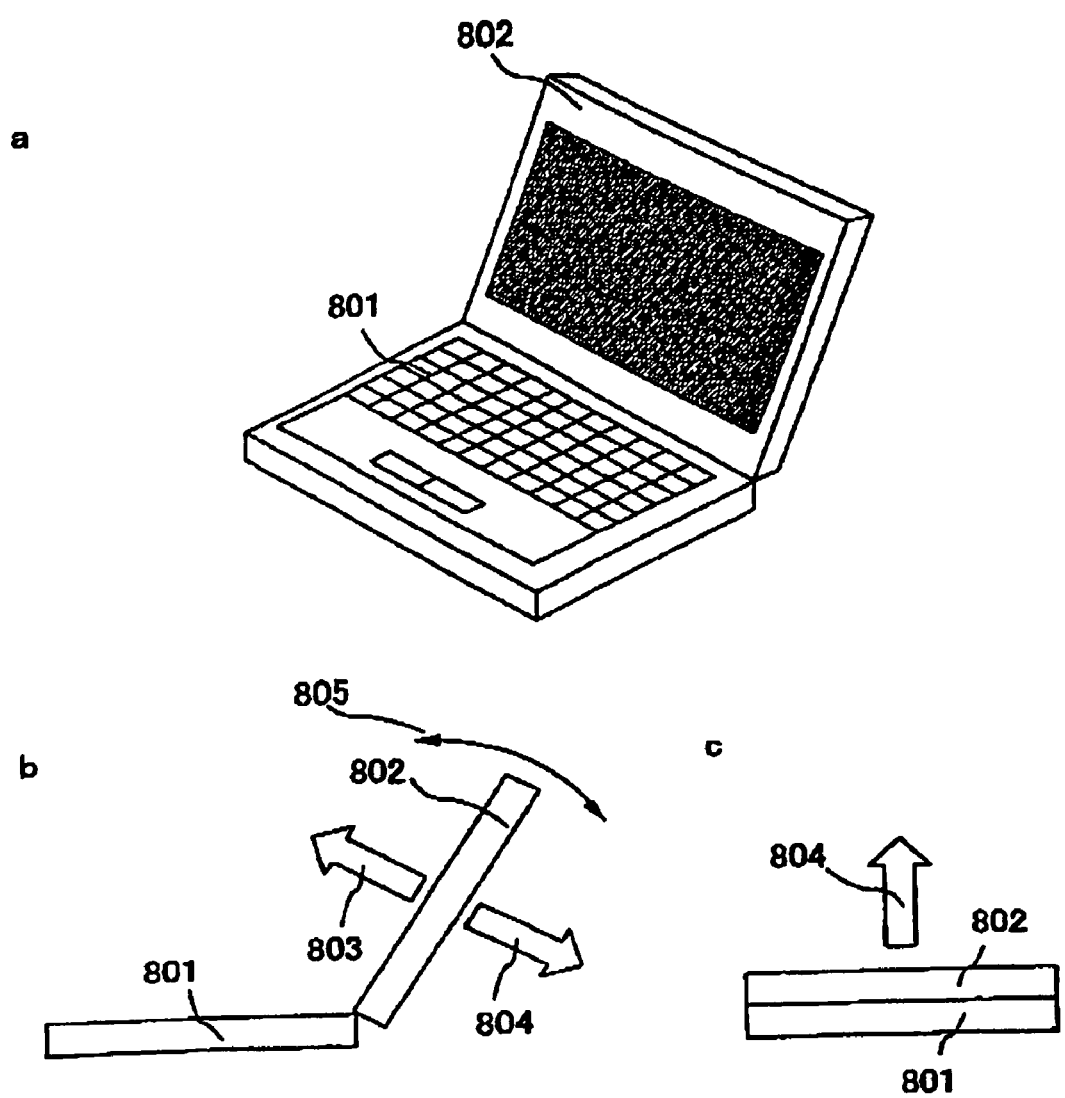
FIGS. 8A through 8C are diagrams showing an example of an electric appliance that uses the light-emitting device according to the invention (example 7).

As the electric appliances that are manufactured with a light-emitting device having an organic light-emitting element according to the invention, a video camera, digital camera, display with goggle (head-mount display), navigation system, audio reproducing device (such as a car audio and audio compo), note type personal computer, game machine, portable information terminal (such as a mobile computer, portable telephone, portable game machine or electronic book) and image reproducing device with a recording medium (specifically a device with a display device that can reproduce a recording medium such as a DVD and display the image) can be cited. Specific examples of these electric appliances are shown in FIGS. 7 and 8.

FIG. 7A shows a display device and the display device includes a chassis 7101, a support table 7102, a display portion 7103, a speaker portion 7104 and a video input terminal 7105. A light-emitting device having an organic light-emitting element according to the invention is used to manufacture the display portion 7103. The display device includes all information display devices for use in personal computer, TV broadcast receiver, and billboard display.

FIG. 7B shows a note type personal computer and the note type personal computer includes a body 7201, chassis 7202, display portion 7203, key board 7204, external connection port 7205 and pointing mouth 7206. A light-emitting device having an organic light-emitting element according to the invention is used to manufacture the display portion 7203.

FIG. 7C shows a mobile computer and the mobile computer includes a body 7301, display portion 7302, switch 7303, operation key 7304 and IR port 7305. A light-emitting device having an organic light-emitting element according to the invention is used to manufacture the display portion 7302.

FIG. 7D shows a portable image reproducing device with a recording medium (specifically a DVD reproducing device) and the portable image reproducing device includes a body 7401, chassis 7402, display portion A 7403, display portion B 7404, recording medium (such as DVD) read portion 7405, operation key 7406 and speaker portion 7407. The display portion A 7403 mainly displays image information, the display portion B 7404 mainly displays textual information, and a light-emitting device having an organic light-emitting element according to the invention is used to manufacture each of the display portions A and B. The image reproducing device with a recording medium includes a home game machine and so on.

FIG. 7E shows a goggle type display (head-mount display) and the goggle type display includes a body 7501, display portion 7502 and arm portion 7503. A light-emitting device having an organic light-emitting element according to the invention is used to manufacture the display portion 7502.

FIG. 7F shows a video camera and the video camera includes a body 7601, display portion 7602, chassis 7603, external connection port 7604, remote control receiving portion 7605, image receiver 7606, battery 7607, audio input portion 7608, operation key 7609 and eye pieces 7610. A light-emitting device having an organic light-emitting element according to the invention is used to manufacture the display portion 7602.

FIG. 7G shows a portable telephone and the portable telephone includes a body 7701, chassis 7702, display portion 7703, audio input portion 7704, audio output portion 7705, operation key 7706, external connection port 7707 and antenna 7708. A light-emitting device having an organic light-emitting element according to the invention is used to manufacture the display portion 7703. When the display portion 7703 displays white characters against a black background, the power consumption of the portable telephone can be suppressed low.

FIG. 8A shows a double-sided emission type note type personal computer and the note type personal computer includes a keyboard 801, display portion 802 and so on. The characteristic point of the note type personal computer is in that as shown in FIG. 8B both emissions 803 and 804 to a front surface and to a back surface are made possible. This can be achieved by applying the light-emitting device having a double-sided emission type structure according to the invention shown in for instance FIG. 6B to the display portion 802. When thus configured, as shown in FIG. 8C, even in a state where the display portion 802 is closed, by making use of emission to a back surface, an image and so on can be observed. A direction of opening the display portion is shown with 805.

As mentioned above, a range of applications of a light-emitting device having an organic light-emitting element according to the invention is very broad and the light-emitting device can be applied to all kinds of electric appliances.

What is claimed is:

1. An organic light-emitting element comprising:
   an anode;
   a cathode; and
   an electroluminescent layer provided between the anode and the cathode, the electroluminescent layer comprising:
   at least one first emission region; and
   at least one second emission region, wherein the maximum peak of an emission spectrum of the at least one second emission region is located in a longer wavelength side than the at least one first emission region,
   wherein emission in the at least one second emission region is one from a triplet excitation state, and
   wherein the at least one second emission region is located apart from the first emission region.

2. An organic light-emitting element comprising:
   an anode;
   a cathode; and
   an electroluminescent layer provided between the anode and the cathode, the electroluminescent layer comprising:
   at least one first emission region; and
   at least one second emission region, wherein the maximum peak of an emission spectrum of the at least one second emission region is located in a longer wavelength side than the at least one first emission region,
   wherein emission in the at least one second emission region is one from a triplet excitation state, and
   wherein the at least one second emission region is located apart from the first emission region; and
   wherein the second emission region is constituted of a host material and a guest material that exhibits emission from a triplet excitation state.

3. An organic light-emitting element comprising:
   an anode;
   a cathode; and
   an electroluminescent layer provided between the anode and the cathode, the electroluminescent layer comprising:
   at least one first emission region; and
   at least one second emission region, wherein the maximum peak of an emission spectrum of the at least one second emission region is located in a longer wavelength side than the at least one first emission region,
   wherein emission in the at least one second emission region is one from a triplet excitation state, and
   wherein the at least one second emission region is located apart from the first emission region; and
   wherein the emission from the first emission region is one from a singlet excitation state.

4. An organic light-emitting element comprising:
   an anode;
   a cathode; and
   an electroluminescent layer provided between the anode and the cathode, the electroluminescent layer comprising:
   at least one first emission region; and
   at least one second emission region, wherein the maximum peak of an emission spectrum of the at least one second emission region is located in a longer wavelength side than the at least one first emission region,
   wherein emission in the at least one second emission region is one from a triplet excitation state, and
   wherein the at least one second emission region is located apart from the first emission region; and
   wherein the second emission region is constituted of a host material and a guest material that exhibits emission from a triplet excitation state; and
   wherein the emission from the first emission region is one from a singlet excitation state.

5. An organic light-emitting element comprising:
   an anode;
   a cathode; and
   an electroluminescent layer provided between the anode and the cathode, the electroluminescent layer comprising:
   at least one first emission region; and
   at least one second emission region, wherein the maximum peak of an emission spectrum of the at least one second emission region is located in a longer wavelength side than the at least one first emission region,
   wherein emission in the at least one second emission region is one from a triplet excitation state, and
   wherein the at least one second emission region is located apart from the first emission region; and
   wherein the first emission region is one that includes a host material and one kind or a plurality of guest materials that exhibits emission from a singlet excitation state.

6. An organic light-emitting element comprising:
   an anode;
   a cathode; and an electroluminescent layer provided between the anode and the cathode, the electroluminescent layer comprising:
at least one first emission region; and
at least one second emission region, wherein the maximum peak of an emission spectrum of the at least one second emission region is located in a longer wavelength side than the at least one first emission region,
wherein emission in the at least one second emission region is one from a triplet excitation state, and
wherein the at least one second emission region is located apart from the first emission region; and
wherein the second emission region is constituted of a host material and a guest material that exhibits emission from a triplet excitation state; and
wherein the first emission region is one that includes a host material and one kind or a plurality of guest materials that exhibits emission from a singlet excitation state.

7. An organic light-emitting element comprising:
an anode;
a cathode; and
an electroluminescent layer provided between the anode and the cathode, the electroluminescent layer comprising:
at least one first emission region; and
at least one second emission region, wherein the maximum peak of an emission spectrum of the at least one second emission region is located in a longer wavelength side than the at least one first emission region,
wherein emission in the at least one second emission region is one from a triplet excitation state, and
wherein the at least one second emission region is located apart from the first emission region;
wherein the first emission region is located toward an anode more than the second emission region; and
wherein, between the first emission region and the second emission region, a hole block layer made of a hole block material that has an ionization potential larger than a substance having the largest ionization potential of substances contained in the first emission region is disposed.

8. An organic light-emitting element according to claim 7, wherein a value of the ionization potential of the hole block material is 0.4 eV or more larger than a value of the ionization potential of a substance that has the largest ionization potential of substances contained in the first emission region.

9. An organic light-emitting element according to claim 1, wherein a distance between the first emission region and the second emission region is 1 nm or more and 30 nm or less.

10. An organic light-emitting element according to claim 1, wherein an emission spectrum in the first emission region has at least one peak in a region of 400 nm or more and 500 nm or less.

11. An organic light-emitting element according to claim 1, wherein an emission spectrum in the first emission region has at least two peaks in a region of 400 nm or more and 560 nm or less.

12. An organic light-emitting element according to claim 1, wherein an emission spectrum in the second emission region has at least one peak in a region of 560 nm or more and 700 nm or less.

13. An organic light-emitting element according to claim 1, wherein an emission spectrum in the first emission region has at least one peak in a region of 400 nm or more and 500 nm or less; and
an emission spectrum in the second emission region has at least one peak in a region of 560 nm or more and 700 nm or less.

14. An organic light-emitting element according to claim 1, wherein an emission spectrum in the first emission region has at least two peaks in a region of 400 nm or more and 560 nm or less; and
an emission spectrum in the second emission region has at least one peak in a region of 560 nm or more and 700 nm or less.

15. An organic light-emitting element according to claim 1, wherein the emission in the first emission region includes excimer emission.

16. An organic light-emitting element according to claim 1, wherein the emission in the second emission region is one from an organometallic complex.

17. An organic light-emitting element according to claim 16, wherein the organometallic complex has iridium or platinum as a central metal.

18. An organic light-emitting element according to claim 2, wherein a distance between the first emission region and the second emission region is 1 nm or more and 30 nm or less.

19. An organic light-emitting element according to claim 3, wherein a distance between the first emission region and the second emission region is 1 nm or more and 30 nm or less.

20. An organic light-emitting element according to claim 4, wherein a distance between the first emission region and the second emission region is 1 nm or more and 30 nm or less.

21. An organic light-emitting element according to claim 5, wherein a distance between the first emission region and the second emission region is 1 nm or more and 30 nm or less.

22. An organic light-emitting element according to claim 6, wherein a distance between the first emission region and the second emission region is 1 nm or more and 30 nm or less.

23. An organic light-emitting element according to claim 7, wherein a distance between the first emission region and the second emission region is 1 nm or more and 30 nm or less.

24. An organic light-emitting element according to claim 2, wherein an emission spectrum in the first emission region has at least one peak in a region of 400 nm or more and 500 nm or less.

25. An organic light-emitting element according to claim 3, wherein an emission spectrum in the first emission region has at least one peak in a region of 400 nm or more and 500 nm or less.

26. An organic light-emitting element according to claim 4, wherein an emission spectrum in the first emission region has at least one peak in a region of 400 nm or more and 500 nm or less.

27. An organic light-emitting element according to claim 5, wherein an emission spectrum in the first emission region has at least one peak in a region of 400 nm or more and 500 nm or less.

28. An organic light-emitting element according to claim 6, wherein an emission spectrum in the first emission region has at least one peak in a region of 400 nm or more and 500 nm or less.

29. An organic light-emitting element according to claim 7, wherein an emission spectrum in the first emission region has at least one peak in a region of 400 nm or more and 500 nm or less.

30. An organic light-emitting element according to claim 2, wherein an emission spectrum in the first emission region has at least two peaks in a region of 400 nm or more and 560 nm or less.

31. An organic light-emitting element according to claim 3, wherein an emission spectrum in the first emission region has at least two peaks in a region of 400 nm or more and 560 nm or less.

32. An organic light-emitting element according to claim 4, wherein an emission spectrum in the first emission region has at least two peaks in a region of 400 nm or more and 560 nm or less.

33. An organic light-emitting element according to claim 5, wherein an emission spectrum in the first emission region has at least two peaks in a region of 400 nm or more and 560 nm or less.

34. An organic light-emitting element according to claim 6, wherein an emission spectrum in the first emission region has at least two peaks in a region of 400 nm or more and 560 nm or less.

35. An organic light-emitting element according to claim 7, wherein an emission spectrum in the first emission region has at least two peaks in a region of 400 nm or more and 560 nm or less.

36. An organic light-emitting element according to claim 2, wherein an emission spectrum in the second emission region has at least one peak in a region of 560 nm or more and 700 nm or less.

37. An organic light-emitting element according to claim 3, wherein an emission spectrum in the second emission region has at least one peak in a region of 560 nm or more and 700 nm or less.

38. An organic light-emitting element according to claim 4, wherein an emission spectrum in the second emission region has at least one peak in a region of 560 nm or more and 700 nm or less.

39. An organic light-emitting element according to claim 5, wherein an emission spectrum in the second emission region has at least one peak in a region of 560 nm or more and 700 nm or less.

40. An organic light-emitting element according to claim 6, wherein an emission spectrum in the second emission region has at least one peak in a region of 560 nm or more and 700 nm or less.

41. An organic light-emitting element according to claim 7, wherein an emission spectrum in the second emission region has at least one peak in a region of 560 nm or more and 700 nm or less.

42. An organic light-emitting element according to claim 2, wherein an emission spectrum in the first emission region has at least one peak in a region of 400 nm or more and 500 nm or less; and
an emission spectrum in the second emission region has at least one peak in a region of 560 nm or more and 700 nm or less.

43. An organic light-emitting element according to claim 3, wherein an emission spectrum in the first emission region has at least one peak in a region of 400 nm or more and 500 nm or less; and
an emission spectrum in the second emission region has at least one peak in a region of 560 nm or more and 700 nm or less.

44. An organic light-emitting element according to claim 4, wherein an emission spectrum in the first emission region has at least one peak in a region of 400 nm or more and 500 nm or less; and
an emission spectrum in the second emission region has at least one peak in a region of 560 nm or more and 700 nm or less.

45. An organic light-emitting element according to claim 5, wherein an emission spectrum in the first emission region has at least one peak in a region of 400 nm or more and 500 nm or less; and
an emission spectrum in the second emission region has at least one peak in a region of 560 nm or more and 700 nm or less.

46. An organic light-emitting element according to claim 6, wherein an emission spectrum in the first emission region has at least one peak in a region of 400 nm or more and 500 nm or less; and
an emission spectrum in the second emission region has at least one peak in a region of 560 nm or more and 700 nm or less.

47. An organic light-emitting element according to claim 7, wherein an emission spectrum in the first emission region has at least one peak in a region of 400 nm or more and 500 nm or less; and
an emission spectrum in the second emission region has at least one peak in a region of 560 nm or more and 700 nm or less.

48. An organic light-emitting element according to claim 2, wherein an emission spectrum in the first emission region has at least two peaks in a region of 400 nm or more and 560 nm or less; and
an emission spectrum in the second emission region has at least one peak in a region of 560 nm or more and 700 nm or less.

49. An organic light-emitting element according to claim 3, wherein an emission spectrum in the first emission region has at least two peaks in a region of 400 nm or more and 560 nm or less; and
an emission spectrum in the second emission region has at least one peak in a region of 560 nm or more and 700 nm or less.

50. An organic light-emitting element according to claim 4, wherein an emission spectrum in the first emission region has at least two peaks in a region of 400 nm or more and 560 nm or less; and
an emission spectrum in the second emission region has at least one peak in a region of 560 nm or more and 700 nm or less.

51. An organic light-emitting element according to claim 5, wherein an emission spectrum in the first emission region has at least two peaks in a region of 400 nm or more and 560 nm or less; and
an emission spectrum in the second emission region has at least one peak in a region of 560 nm or more and 700 nm or less.

52. An organic light-emitting element according to claim 6, wherein an emission spectrum in the first emission region has at least two peaks in a region of 400 nm or more and 560 nm or less; and
an emission spectrum in the second emission region has at least one peak in a region of 560 nm or more and 700 nm or less.

53. An organic light-emitting element according to claim 7, wherein an emission spectrum in the first emission region has at least two peaks in a region of 400 nm or more and 560 nm or less; and
an emission spectrum in the second emission region has at least one peak in a region of 560 nm or more and 700 nm or less.

54. An organic light-emitting element according to claim 2, wherein the emission in the first emission region includes excimer emission.

55. An organic light-emitting element according to claim 3, wherein the emission in the first emission region includes excimer emission.

56. An organic light-emitting element according to claim 4, wherein the emission in the first emission region includes excimer emission.

57. An organic light-emitting element according to claim 5, wherein the emission in the first emission region includes excimer emission.

58. An organic light-emitting element according to claim 6, wherein the emission in the first emission region includes excimer emission.

59. An organic light-emitting element according to claim 7, wherein the emission in the first emission region includes excimer emission.

60. An organic light-emitting element according to claim 2, wherein the emission in the second emission region is one from an organometallic complex.

61. An organic light-emitting element according to claim 3, wherein the emission in the second emission region is one from an organometallic complex.

62. An organic light-emitting element according to claim 4, wherein the emission in the second emission region is one from an organometallic complex.

63. An organic light-emitting element according to claim 5, wherein the emission in the second emission region is one from an organometallic complex.

64. An organic light-emitting element according to claim 6, wherein the emission in the second emission region is one from an organometallic complex.

65. An organic light-emitting element according to claim 7, wherein the emission in the second emission region is one from an organometallic complex.

66. An organic light-emitting element according to claim 60, wherein the organometallic complex has iridium or platinum as a central metal.

67. An organic light-emitting element according to claim 61, wherein the organometallic complex has iridium or platinum as a central metal.

68. An organic light-emitting element according to claim 62, wherein the organometallic complex has iridium or platinum as a central metal.

69. An organic light-emitting element according to claim 63, wherein the organometallic complex has iridium or platinum as a central metal.

70. An organic light-emitting element according to claim 64, wherein the organometallic complex has iridium or platinum as a central metal.

71. An organic light-emitting element according to claim 65, wherein the organometallic complex has iridium or platinum as a central metal.

* * * * *